(12) United States Patent
Matsudera et al.

(10) Patent No.: US 7,206,242 B2
(45) Date of Patent: Apr. 17, 2007

(54) SEMICONDUCTOR MEMORY

(75) Inventors: Katsuki Matsudera, Kawasaki (JP);
Kazuhide Yoneya, Sagamihara (JP);
Masaru Koyanagi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/013,688

(22) Filed: Dec. 17, 2004

(65) Prior Publication Data
US 2005/0152205 A1 Jul. 14, 2005

(30) Foreign Application Priority Data
Dec. 22, 2003 (JP) ............................. 2003-424223

(51) Int. Cl.
*G11C 7/00* (2006.01)
(52) U.S. Cl. .................................... 365/219
(58) Field of Classification Search ................ 365/219
See application file for complete search history.

(56) References Cited

U.S. PATENT DOCUMENTS

| 6,198,649 | B1 * | 3/2001 | Matsudera et al. ............ 365/63 |
|---|---|---|---|
| 6,466,490 | B2 * | 10/2002 | Nagai et al. ............ 365/189.12 |
| 6,498,741 | B2 | 12/2002 | Matsudera et al. |
| 6,510,087 | B2 | 1/2003 | Kudou et al. |
| 6,570,800 | B2 * | 5/2003 | Tanaka et al. ............... 365/219 |
| 6,600,691 | B2 * | 7/2003 | Morzano et al. ............ 365/219 |
| 6,801,144 | B2 | 10/2004 | Matsudera et al. |
| 2004/0128578 | A1 * | 7/2004 | Jonnalagadda ............... 713/400 |

FOREIGN PATENT DOCUMENTS

JP 2000-188381 7/2000

* cited by examiner

*Primary Examiner*—Amir Zarabian
*Assistant Examiner*—Kretelia Graham
(74) *Attorney, Agent, or Firm*—Oblon, Spivak, McClelland, Maier & Neustadt, P.C.

(57) ABSTRACT

A semiconductor memory includes a converter configured to convert each read-data of plural bits read from a memory core into serial data, respectively, in synchronization with a read clock to generate converted read-data. An output register holds the converted read-data in synchronization with the read clock. A selector selects one bit from each plural bits of the converted read-data, in accordance with a control data, and to supply the selected bit to the output register.

18 Claims, 17 Drawing Sheets

FIG. 3

| MODE | 8 BITS MODE | | 4 BITS MODE | |
|---|---|---|---|---|
| RAD1 | "0" | "1" | "0" | "1" |
| MX21a | RD_0<3> | RD_1<3> | RD_0<3> | RD_1<3> |
| MX21b | RD_0<2> | RD_1<2> | RD_0<2> | RD_1<2> |
| MX21c | RD_0<1> | RD_1<1> | RD_0<1> | RD_1<1> |
| MX21d | RD_0<0> | RD_1<0> | RD_0<0> | RD_1<0> |
| MX21e | RD_2<0> | RD_3<0> | RD_2<0> | RD_3<0> |
| MX21f | RD_2<1> | RD_3<1> | RD_2<1> | RD_3<1> |
| MX21g | RD_2<2> | RD_3<2> | RD_2<2> | RD_3<2> |
| MX21h | RD_2<3> | RD_3<3> | RD_2<3> | RD_3<3> |

FIG. 4

| MODE | 4 BITS MODE | |
|---|---|---|
| RAD2 | "0" | "1" |
| MX25a | eR0 | eR2 |
| MX25b | oR0 | oR2 |

FIG. 7

| MODE | 8 BITS MODE | | 4 BITS MODE | |
|---|---|---|---|---|
| RAD1 | "0" | "1" | "0" | "1" |
| MX63a | eR0 | eR1 | eR0 | eR1 |
| MX63b | oR0 | oR1 | oR0 | oR1 |
| MX63c | eR2 | eR3 | eR2 | eR3 |
| MX63d | oR2 | oR3 | oR2 | oR3 |

FIG. 8

| MODE | 4 BITS MODE | |
|---|---|---|
| RAD2 | "0" | "1" |
| MX68a | OUTPUT Lat65b | eRead<2> |
| MX68b | OUTPUT FF66b | oRead<2> |

FIG. 10

| MODE | 8 BITS MODE | | 4 BITS MODE | | 2 BITS MODE | |
|---|---|---|---|---|---|---|
| RAD1 | "0" | "1" | "0" | "1" | "0" | "1" |
| MX81a | RD_2<2> | RD_3<2> | RD_2<2> | RD_3<2> | RD_2<2> | RD_3<2> |
| MX81b | RD_0<2> | RD_1<2> | RD_0<2> | RD_1<2> | RD_0<2> | RD_1<2> |
| MX81c | RD_2<0> | RD_3<0> | RD_2<0> | RD_3<0> | RD_2<0> | RD_3<0> |
| MX81d | RD_0<0> | RD_1<0> | RD_0<0> | RD_1<0> | RD_0<0> | RD_1<0> |
| MX81e | RD_4<0> | RD_5<0> | RD_4<0> | RD_5<0> | RD_4<0> | RD_5<0> |
| MX81f | RD_6<0> | RD_7<0> | RD_6<0> | RD_7<0> | RD_6<0> | RD_7<0> |
| MX81g | RD_4<2> | RD_5<2> | RD_4<2> | RD_5<2> | RD_4<2> | RD_5<2> |
| MX81h | RD_6<2> | RD_7<2> | RD_6<2> | RD_7<2> | RD_6<2> | RD_7<2> |

FIG. 11

| MODE | 4 BITS MODE | | 2 BITS MODE | |
|---|---|---|---|---|
| RAD2 | "0" | "1" | "0" | "1" |
| MX85a | eR0 | eR2 | eR0 | eR2 |
| MX85b | eR4 | eR6 | eR4 | eR6 |

| MODE | 8 BITS MODE | | 4 BITS MODE | |
|---|---|---|---|---|
| RAD1 | "0" | "1" | "0" | "1" |
| MX114a | ML113a | eR1a | ML113a | eR1a |
| MX114b | ML113b | eR1b | ML113b | eR1b |

FIG. 16

| MODE | 4 BITS MODE | |
|---|---|---|
| WAD1 | "0" | "1" |
| MX45a | eW0 | eW2 |
| MX45b | oW0 | oW2 |

FIG. 17

| MODE | 8 BITS MODE | | 4 BITS MODE | |
|---|---|---|---|---|
| WAD2 | "0" | "1" | "0" | "1" |
| MX41a | WD_0<3> | WD_1<3> | WD_0<3> | WD_1<3> |
| MX41b | WD_0<2> | WD_1<2> | WD_0<2> | WD_1<2> |
| MX41c | WD_0<1> | WD_1<1> | WD_0<1> | WD_1<1> |
| MX41d | WD_0<0> | WD_1<0> | WD_0<0> | WD_1<0> |
| MX41e | WD_2<0> | WD_3<0> | WD_2<0> | WD_3<0> |
| MX41f | WD_2<1> | WD_3<1> | WD_2<1> | WD_3<1> |
| MX41g | WD_2<2> | WD_3<2> | WD_2<2> | WD_3<2> |
| MX41h | WD_2<3> | WD_3<3> | WD_2<3> | WD_3<3> |

FIG. 20

| MODE | 4 BITS MODE | |
|---|---|---|
| WAD1 | "0" | "1" |
| MX78a | FF75b | FF75c |
| MX78b | Lat76b | Lat76c |

FIG. 21

| MODE | 8 BITS MODE | | 4 BITS MODE | |
|---|---|---|---|---|
| WAD2 | "0" | "1" | "0" | "1" |
| MX73a | eW0 | eW1 | eW0 | eW1 |
| MX73b | oW0 | oW1 | oW0 | oW1 |
| MX73c | eW2 | eW3 | eW2 | eW3 |
| MX73d | oW2 | oW3 | oW2 | oW3 |

FIG. 23

| MODE | 4 BITS MODE | | 2 BITS MODE | |
|---|---|---|---|---|
| WAD2 | "0" | "1" | "0" | "1" |
| MX95a | eW0 | eW2 | eW0 | eW2 |
| MX95b | eW4 | eW6 | eW4 | eW6 |

FIG. 24

| MODE | 8 BITS MODE | | 4 BITS MODE | | 2 BITS MODE | |
|---|---|---|---|---|---|---|
| WAD3 | "0" | "1" | "0" | "1" | "0" | "1" |
| MX91a | WD_2<2> | WD_3<2> | WD_2<2> | WD_3<2> | WD_2<2> | WD_3<2> |
| MX91b | WD_0<2> | WD_1<2> | WD_0<2> | WD_1<2> | WD_0<2> | WD_1<2> |
| MX91c | WD_2<0> | WD_3<0> | WD_2<0> | WD_3<0> | WD_2<0> | WD_3<0> |
| MX91d | WD_0<0> | WD_1<0> | WD_0<0> | WD_1<0> | WD_0<0> | WD_1<0> |
| MX91e | WD_4<0> | WD_5<0> | WD_4<0> | WD_5<0> | WD_4<0> | WD_5<0> |
| MX91f | WD_6<0> | WD_7<0> | WD_6<0> | WD_7<0> | WD_6<0> | WD_7<0> |
| MX91g | WD_4<2> | WD_5<2> | WD_4<2> | WD_5<2> | WD_4<2> | WD_5<2> |
| MX91h | WD_6<2> | WD_7<2> | WD_6<2> | WD_7<2> | WD_6<2> | WD_7<2> |

US 7,206,242 B2

SEMICONDUCTOR MEMORY

CROSS REFERENCE TO RELATED APPLICATION AND INCORPORATION BY REFERENCE

This application is based upon and claims the benefit of priority from the prior Japanese Patent Application No. P2003-424223, filed on Dec. 22, 2003; the entire contents of which are incorporated herein by reference.

BACKGROUND OF THE INVENTION

1. Field of the Invention

The present invention relates to a semiconductor memory which has a bit width control function of input/output (I/O) data.

2. Description of the Related Art

With the development of a minute processing technique, the capacity and operation speed of a semiconductor memory has increased. User's requests for product have diversified. In order to increase the capacity, a decrease in bit width of address data and an increase in bit width of I/O data are required. In order to increase operation speed, serial input and output functions in synchronization with a high-speed clock, i.e., burst mode, is required. It is possible to improve the number of bits of I/O data per time by use of the burst mode.

With respect to a semiconductor memory having wide bit width, it is desirable to vary the bit width of the I/O data. A semiconductor memory having a bit width control function of the output data includes a memory core, a plurality of multiplexers connected to the memory core, and a plurality of shift registers connected to the multiplexers. Each multiplexer selects read-data from the memory core for read out. The output data of multiplexer is subjected to parallel-serial (P/S) convert by the shift registers.

However, since the memory core takes up most of the area on the semiconductor chip, the length of the longest wire between the memory core and the multiplexers is about ¼ of the length of the long side of the semiconductor chip. The wiring resistance caused by each input of the multiplexers creates a large delay. As a result, dispersion of wiring delay occurs in the wiring between the memory core and the multiplexers. In order to reduce such delay, it is necessary to increase the width of each wiring by use of upper wiring layer. Therefore, when the bit width control function of the I/O data is added to a semiconductor memory capable of transmitting and receiving the data at high speed, the chip size of the semiconductor memory increases.

SUMMARY OF THE INVENTION

An aspect of the present invention inheres in a semiconductor memory encompassing a converter configured to convert each read-data of plural bits read from a memory core into serial data, respectively, in synchronization with a read clock to generate converted read-data, an output register configured to hold the converted read-data in synchronization with the read clock, and a selector configured to select one bit from each plural bits of the converted read-data, in accordance with a control data, and to supply the selected bit to the output register.

Another aspect of the present invention inheres in a semiconductor memory encompassing an input register configured to hold write-data in synchronization with a write clock, a converter configured to convert each bit of the held write-data into parallel data in synchronization with the write clock, and to supply the converted write-data to a memory core, and a distributor configured to distribute the held write-data to the converter in accordance with control data.

BRIEF DESCRIPTION OF THE DRAWINGS

FIG. 3 is a table showing an operation of an input selector in eight bits mode and four bits mode according to the first embodiment of the present invention;

FIG. 4 is a table showing an operation of a selector in four bits mode according to the first embodiment of the present invention;

FIG. 7 is a table showing an operation of a selector in eight bits mode and four bits mode according to the first modification of the first embodiment of the present invention;

FIG. 8 is a table showing an operation of an output selector in four bits mode according to the first modification of the first embodiment of the present invention;

FIG. 10 is a table showing an operation of an input selector in eight bits mode, four bits mode, and two bits mode according to the second modification of the first embodiment of the present invention;

FIG. 11 is a table showing an operation of a selector in four bits mode and two bits mode according to the second modification of the first embodiment of the present invention;

FIG. 16 is a table showing an operation of a distributor in four bits mode according to the second embodiment of the present invention;

FIG. 17 is a table showing an operation of the distributor in eight bits mode and four bits mode according to the second embodiment of the present invention;

FIG. 20 is a table showing an operation of an input distributor in four bits mode according to the first modification of the second embodiment of the present invention;

FIG. 21 is a table showing an operation of a distributor in eight bits mode and four bits mode according to the first modification of the second embodiment of the present invention;

FIG. 23 is a table showing an operation of the distributor in four bits mode and two bits mode according to the second modification of the second embodiment of the present invention; and FIG. 24 is a table showing an operation of the distributor in eight bits mode, four bits mode, and two bits mode according to the second modification of the second embodiment of the present invention.

DETAILED DESCRIPTION OF THE INVENTION

Figure 1:
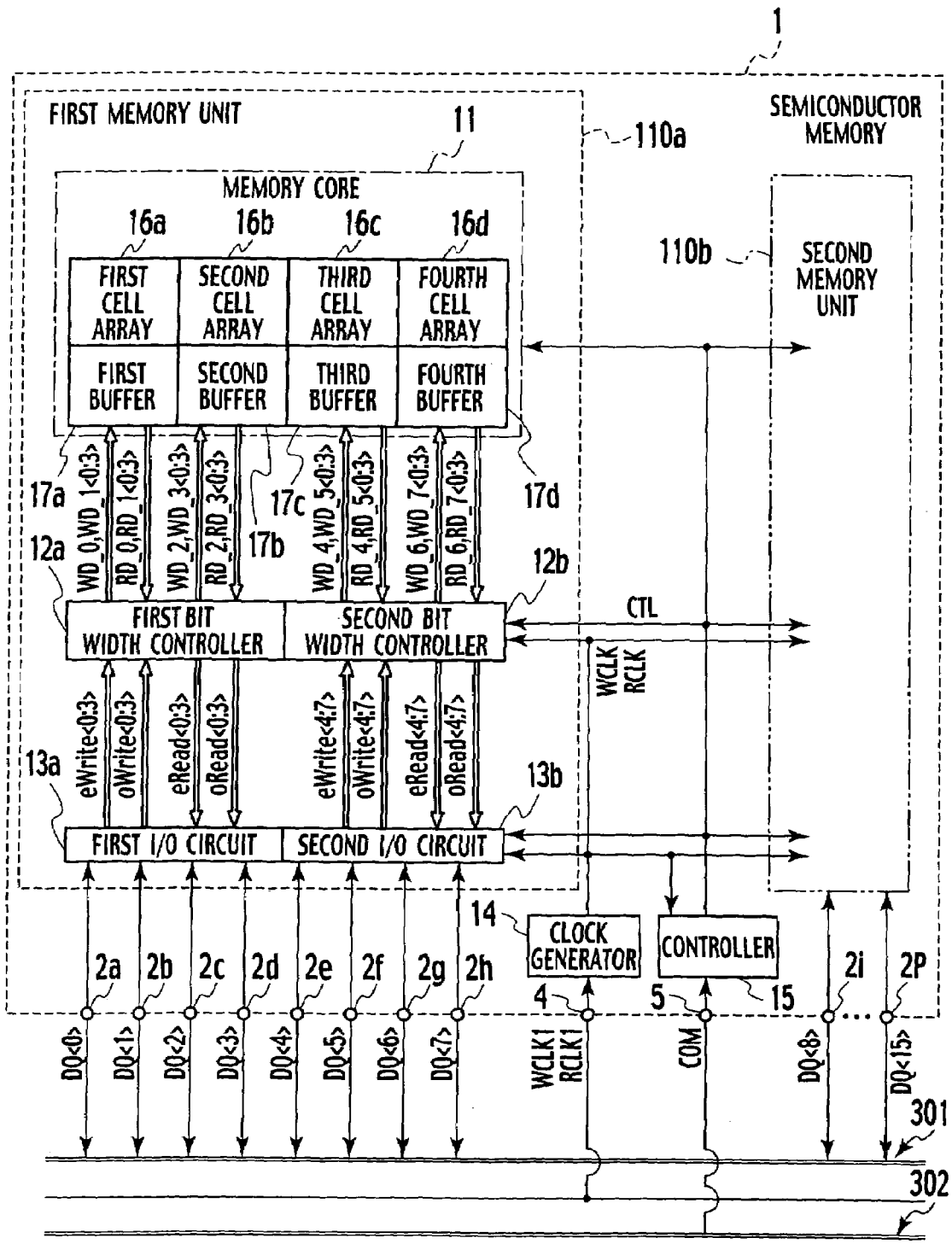
FIG. 1 is a circuit diagram showing an example of entire arrangement of a semiconductor memory according to first and second embodiments of the present invention.

Various embodiments of the present invention will be described with reference to the accompanying drawings. It is to be noted that the same or similar reference numerals are applied to the same or similar parts and elements throughout the drawings, and description of the same or similar parts and elements will be omitted or simplified. In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention with unnecessary detail. In the following description, the words "connect" or "connected" defines a state in which first and second elements are electrically connected to each other without regard to whether or not there is a physical connection between the elements.

(Arrangement of Semiconductor Memory)

Before the detailed description of the first and second embodiments of the present invention, an example of the entire arrangement of the semiconductor memory 1 according to the first and second embodiment will be described by referring to FIG. 1. The semiconductor memory 1 includes a first memory unit 110a, a second memory unit 110b, a clock generator 14, and a controller 15. The semiconductor memory 1 transmits and receives data having a maximum width of 16 bits to a data bus 301. The first memory unit 110a transmits and receives a lower byte DQ<0:7> of the I/O data DQ<0:15> to the data bus 301. Here, the symbol "<A:B>" refers to parallel data having bit width of A to B. The second memory unit 110b transmits and receives an upper byte DQ<8:15> of the I/O data DQ<0:15> to the data bus 301. The arrangement of the second memory unit 110b is similar to the first memory unit 110a.

The first memory unit 110a includes a memory core 11, a first bit width controller 12a, a second bit width controller 12b, a first I/O circuit 13a, and a second I/O circuit 13b. The memory core 11 includes first to fourth cell arrays 16a to 16d, and first to fourth buffers 17a to 17d. The first to fourth cell arrays 16a to 16d include a plurality of memory cells arranged in the form of a matrix. The first to fourth buffers 17a to 17d are connected to the first to fourth cell arrays 16a to 16d, respectively.

In a read operation, the first to fourth buffers 17a to 17d read out two sets of data having a width of four bits from the first to fourth cell arrays 16a to 16d, respectively. The first to fourth buffers 17a to 17d amplify the read-data, and supply the amplified read-data to the first bit width controller 12a and the second bit width controller 12b. In a write operation, the first to fourth buffers 17a to 17d receive two sets of write-data having a width of four bits from the first bit width controller 12a and the second bit width controller 12b. The first to fourth buffers 17a to 17d amplify the received write-data, and write the amplified write-data into the first to fourth cell arrays 16a to 16d.

For example, dynamic random access memory (DRAM) cell arrays are used as the first to fourth cell arrays 16a to 16d. The first bit width controller 12a and the second bit width controller 12b controls the bit width of the I/O data. In the following description of the first embodiment, read system of the first bit width controller 12a will be described mainly. In the following description of the second embodiment, write system of the first bit width controller 12a will be described mainly.

(First Embodiment)

Figure 2:
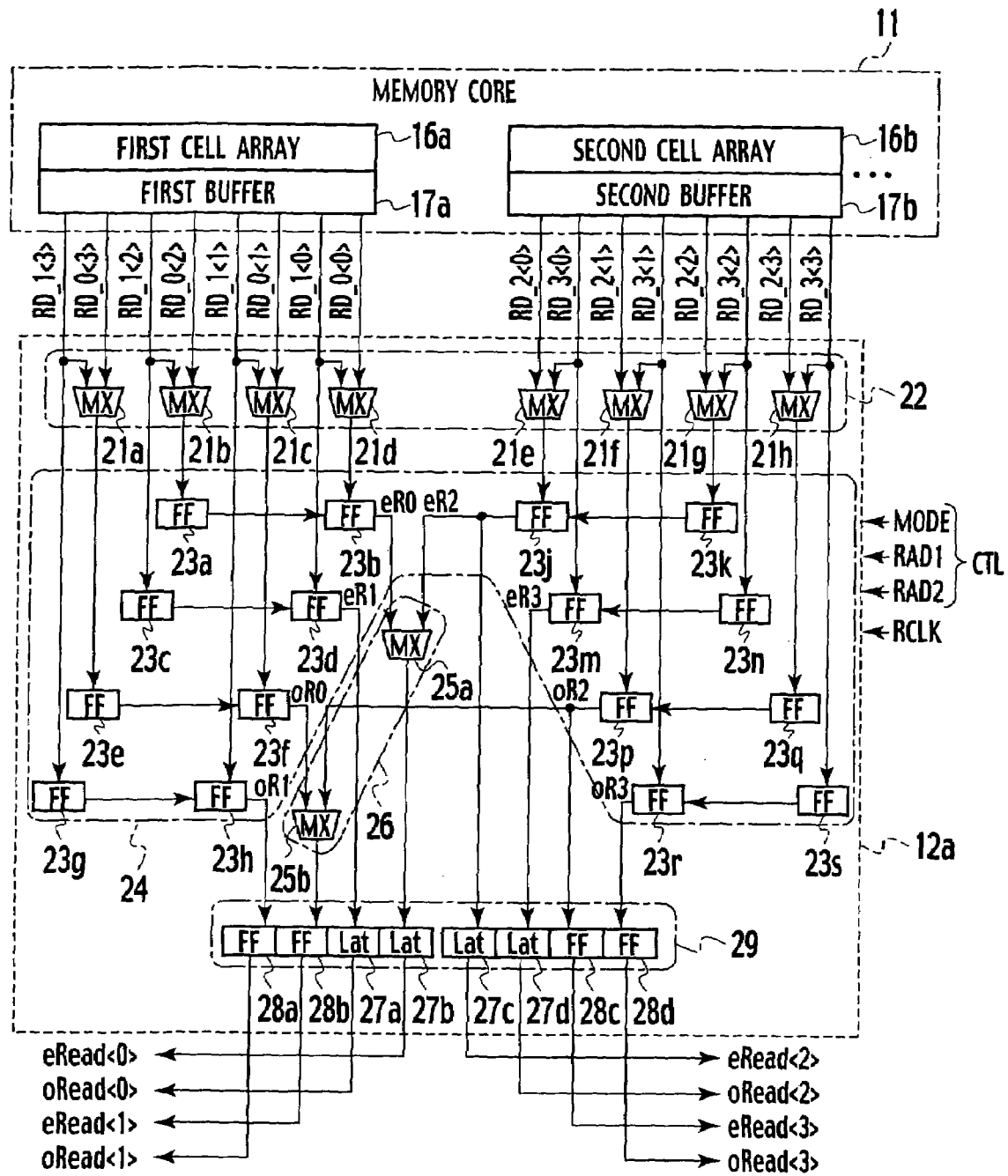
FIG. 2 is a circuit diagram showing a bit width controller according to the first embodiment of the present invention.

As shown in FIG. 2, the first bit width controller 12a according to a first embodiment of the present invention includes an input selector 22, a converter 24, a selector 26, and an output register 29. The converter 24 converts the read-data RD_0<0:3> to RD_3<0:3> read out from the memory core 11, into serial data in synchronization with a read clock RCLK, for each of the plurality of bits of the read-data RD_0<0:3> to RD_3<0:3>. The converter 24 generates converted read-data eR0 to eR3 and oR0 to oR3. The output register 29 holds the converted read-data eR0 to eR3 and oR0 to oR3 in synchronization with the read clock RCLK. The selector 26 selects a bit of converted read-data eR0 to eR3 and oR0 to oR3 for each of the plurality of bits of the converted read-data eR0 to eR3 and oR0 to oR3, in accordance with control data CTL, and supplies the selected bit to the output register 29. The input selector 22 selects a bit of the read-data RD_0<0:3> to RD_3<0:3> for each of the plurality of bits of the read-data RD_0<0:3> to RD_3<0:3>, in accordance with control data CTL, and supplies the selected bit to the converter 24. The arrangement of the second bit width controller 12b shown in FIG. 1 is similar to the first bit width controller 12a.

In the example shown in FIG. 2, first bit width controller 12a performs different processing of even bits and odd bits of the read-data RD_0<0:3> to RD_3<0:3>. As a result, read-data having the even bits (hereinafter referred to as "even read-data") eRead<0:3>, and read-data having the odd bits (hereinafter referred to as "odd read-data") oRead<0:3> are generated by the output register 29. The first I/O circuit 13a shown in FIG. 1 selects the even bits and odd bits by turn.

For example, the input selector 22 selects a bit from every two bits of read-data RD_0<0:3> to RD_3<0:3> in accordance with the control data CTL. The converter 24 has 16 inputs and 8 outputs, and the converter 24 includes a plurality of two bit P/S converters. The selector 26 selects a bit from every two bits of the converted read-data eR0 to eR3 and oR0 to oR3 in accordance with the control data CTL.

The first bit width controller 12a shown in FIG. 2 selects one of 16 bits (hereinafter referred to as "16 bits mode"), eight bits (hereinafter referred to as "eight bits mode"), and four bits (hereinafter referred to as "four bits mode") of bit width of the output data of the semiconductor memory 1 shown in FIG. 1.

In the 16 bits mode, the bit width of the read-data RD_0<0:3> to RD_3<0:3> is compressed to ¼ by the converter 24 and the first I/O circuit 13a. In eight bits mode, the bit width of the read-data RD_0<0:3> to RD_3<0:3> is compressed to ⅛ by the input selector 22, the converter 24, and the first I/O circuit 13a. In four bits mode, the bit width of the read-data RD_0<0:3> to RD_3<0:3> is compressed to ¹⁄₁₆ by the input selector 22, the converter 24, the selector 26, and the first I/O circuit 13a. The switch of the bit width of the output data of the semiconductor memory 1 is performed before reading out the read-data from the memory core 11.

The controller 15 shown in FIG. 1 generates the control data CTL. The controller 15 receives a command COM having read address data from the command bus 302 via a command input terminal 5, and generates the control data CTL based on the command COM. As shown in FIG. 2, the control data CTL includes a mode-selecting signal MODE, and upper two bits of the read address data RAD1 and RAD2. The mode-selecting signal MODE, and the read address data RAD1 and RAD2 are used for switching the bit width control operation of the first bit width controller 12a and the second bit width controller 12b. The read address data RAD1 is supplied to the input selector 22. The read address data RAD2 is supplied to the selector 26.

Here, a part of the column address data in read address data for the memory core 11 is used as the read address data RAD1 and RAD2. In the eight bits mode and the four bits mode, a part of I/O data is exchanged to a part of the column address. The exchanged bits are used for the read address data RAD1 and RAD2. As a result, one bit in the column address is increased in the eight bits mode compared with the 16 bits mode. Two bits in the column address are increased in the four bits mode compared with the 16 bits mode.

The clock generator 14 shown in FIG. 1 generates the read clock RCLK. The clock generator 14 generates the read clock RCLK and the write clock WCLK based on a reference read clock RCLK1 and a reference write clock WCLK1 transmitted from external devices via a clock input terminal 4. In order to optimize the signal transmission and the processing time of each circuit from the memory core 11 to the data bus 301, each data output timing of the first buffer 17a, the first bit width controller 12a, and the first I/O circuit 13a is shifted by a half clock cycle of the read clock RCLK.

The input selector 22 includes a plurality of (first to eighth) input multiplexers 21a to 21h. The converter 24 includes a plurality of (first to sixteenth) flip-flops (FFs) 23a to 23h, 23j, 23k, 23m, 23n, and 23p to 23s. The selector 26 includes a plurality of (first and second) multiplexers 25a and 25b. The output register 29 includes a plurality of (first to fourth) output FFs 28a to 28d, and a plurality of (first to fourth) latch circuits 27a to 27d.

The first input multiplexer 21a is connected between the first buffer 17a and the fifth FF 23e. The second input multiplexer 21b is connected between the first buffer 17a and the first FF 23a. The third input multiplexer 21c is connected between the first buffer 17a and the sixth FF 23f. The fourth input multiplexer 21d is connected between the first buffer 17a and the second FF 23b.

The fifth input multiplexer 21e is connected between the second buffer 17b and the ninth FF 23j. The sixth input multiplexer 21f is connected between the second buffer 17b and the thirteenth FF 23p. The seventh input multiplexer 21g is connected between the second buffer 17b and the tenth FF 23k. The eighth input multiplexer 21h is connected between the second buffer 17b and the fourteenth FF 23q.

The first input multiplexer 21a transmits one of the read-data RD_0<3> and RD_1<3> to the fifth FF 23e in accordance with the mode-selecting signal MODE and the read address data RAD1. The second input multiplexer 21b transmits one of the read-data RD_0<2> and RD_1<2> to the first FF 23a in accordance with the mode-selecting signal MODE and the read address data RAD1. The third input multiplexer 21c transmits one of the read-data RD_0<1> and RD_1<1> to the sixth FF 23f in accordance with the mode-selecting signal MODE and the read address data RAD1. The fourth input multiplexer 21d transmits one of the read-data RD_0<0> and RD_1<0> to the second FF 23b in accordance with the mode-selecting signal MODE and the read address data RAD1.

The fifth input multiplexer 21e transmits one of the read-data RD_3<0> and RD_2<0> to the ninth FF 23j in accordance with the mode-selecting signal MODE and the read address data RAD1. The sixth input multiplexer 21f transmits one of the read-data RD_3<1> and RD_2<1> to the thirteenth FF 23p in accordance with the mode-selecting signal MODE and the read address data RAD1. The seventh input multiplexer 21g transmits one of the read-data RD_3<2> and RD_2<2> to the tenth FF 23k in accordance with the mode-selecting signal MODE and the read address data RAD1. The eighth input multiplexer 21h transmits one of the read-data RD_3<3> and RD_2<3> to the fourteenth FF 23q in accordance with the mode-selecting signal MODE and the read address data RAD1.

When the 16 bits mode is selected by the mode-selecting signal MODE, the first input multiplexer 21a selects the read-data RD_0<3> regardless of the read address data RAD1. Similarly, the second input multiplexer 21b selects the read-data RD_0<2> in the 16 bits mode. The third input multiplexer 21c selects the read-data RD_0<1>. The fourth input multiplexer 21d selects the read-data RD_0<0>. The fifth input multiplexer 21e selects the read-data RD_2<0>. The sixth input multiplexer 21f selects the read-data RD_2<1>. The seventh input multiplexer 21g selects the read-data RD_2<2>. The eighth input multiplexer 21h selects the read-data RD_2<3>.

As shown in FIG. 3, the first to eighth input multiplexers 21a to 21h switch the select operation in accordance with the read address data RAD1 in the eight bits mode and the four bits mode. In the eight bits mode and the four bits mode, the first input multiplexer 21a selects read-data RD_0<3> when the read address data RAD1 is a logic value "0", and selects the read-data RD_1<3> when the read address data RAD1 is a logic value "1". Accordingly, it is possible to decrease the bit width of the read-data RD_0<0:3> to RD_3<0:3> by ½ by the first to eighth input multiplexers 21a to 21h in the eight bits mode and the four bits mode.

The converter 24 includes eight sets of two bit P/S converters arranged by the first to sixteenth FF 23a to 23s. As a result, the bit width of the read-data RD_0<0:3> to RD_3<0:3> is compressed by ½ regardless of the mode selecting signal MODE. In the 16 bits mode, the converter 24 converts the read-data RD_0<0:3> to RD_3<0:3> of 16 bits width into eight sets of serial data (converted read-data) eR0, eR1, oR0, oR1, eR2, eR3, oR2, and oR3.

The first FF 23a has an input connected to an output of the second input multiplexer 21b. The second FF 23b has an input connected to each output of the first FF 23a and the fourth input multiplexer 21d. The converted read-data eR0 generated by the second FF 23b is supplied to the first multiplexer 25a. The third FF 23c has an input connected to an output of the first buffer 17a. The fourth FF 23d has an input connected to each output of the third FF 23c and the first buffer 17a. The converted read-data eR1 generated by the fourth FF 23d is supplied to the first latch circuit 27a.

The fifth FF 23e has an input connected to an output of the first input multiplexer 21a. The sixth FF 23f has an input connected to each output of the fifth FF 23e and the third input multiplexer 21c. The converted read-data oR0 generated by the sixth FF 23f is supplied to the second multiplexer 25b.

The seventh FF 23g has an input connected to an output of the first buffer 17a. The eighth FF 23h has an input connected to each output of the seventh FF 23g and the first buffer 17a. The converted read-data oR1 generated by the eighth FF 23h is supplied to the first output FF 28a.

The tenth FF 23k has an input connected to an output of the seventh input multiplexer 21g. The ninth FF 23j has an input connected to each output of the tenth FF 23k and the sixth input multiplexer 21e. The converted read-data eR2 generated by the ninth FF 23j is supplied to the first multiplexer 25a and the third latch circuit 27c.

The twelfth FF 23n has an input connected to an output of the second buffer 17b. The eleventh FF 23m has an input connected to each output of the twelfth FF 23n and the second buffer 17b. The converted read-data eR3 generated by the eleventh FF 23m is supplied to the fourth latch circuit 27d.

The fourteenth FF 23q has an input connected to an output of the eighth input multiplexer 21h. The thirteenth FF 23p has an input connected to an output of the sixth input multiplexer 21f. The converted read-data oR2 generated by the thirteenth FF 23p is supplied to the second multiplexer 25b and the third output FF 28c.

The sixteenth FF 23s has an input connected to an output of the second buffer 17b. The fifteenth FF 23r has an input connected to each output of the sixteenth FF 23s and the second buffer 17b. The converted read-data oR3 generated by the fifteenth FF 23r is supplied to the fourth output FF 28d.

Moreover, the first multiplexer 25a has an output connected to an input of the second latch circuit 27b. The second multiplexer 25b has an output connected to an input of the second output FF 28b. In the 16 bits mode and the eight bits mode, the first multiplexer 25a selects converted read-data eR0 regardless of the read address data RAD2. In 16 bits mode and the eight bits mode, the second multiplexer 25b selects the converted read-data oR0 regardless of the read address data RAD2.

As shown in FIG. 4, in the four bits mode, the first multiplexer 25a and the second multiplexer 25b switch the select operation in accordance with the read address data RAD2. For example, in four bits mode, the first multiplexer 25a selects the converted read-data eR0 when the read address data RAD2 is a logic value "0", and selects the converted read-data eR2 when the read address data RAD2 is a logic value "1".

The first to fourth output FFs 28a to 28d transfer the odd read-data oRead<0:3> to the first I/O circuit 13a shown in FIG. 1 in synchronization with tailing edges of the read clock RCLK. The first to fourth latch circuits 27a to 27d transfer the even read-data eRead<0:3> to the first I/O circuit 13a in synchronization with leading edges of the read clock RCLK. As a result, odd read-data oRead<0:3> has a phase delayed by a half clock cycle of the read clock RCLK from the even read-data eRead<0:3>.

Next, the operation of the semiconductor memory according to the first embodiment of the present invention will be described referring to time charts shown in FIG. 5A to FIG. 5I. The case of transmitting the read-data from the first cell array 16a shown in FIG. 1 to the data bus 301 via the first input terminal 2a will be described.

Figure 5:
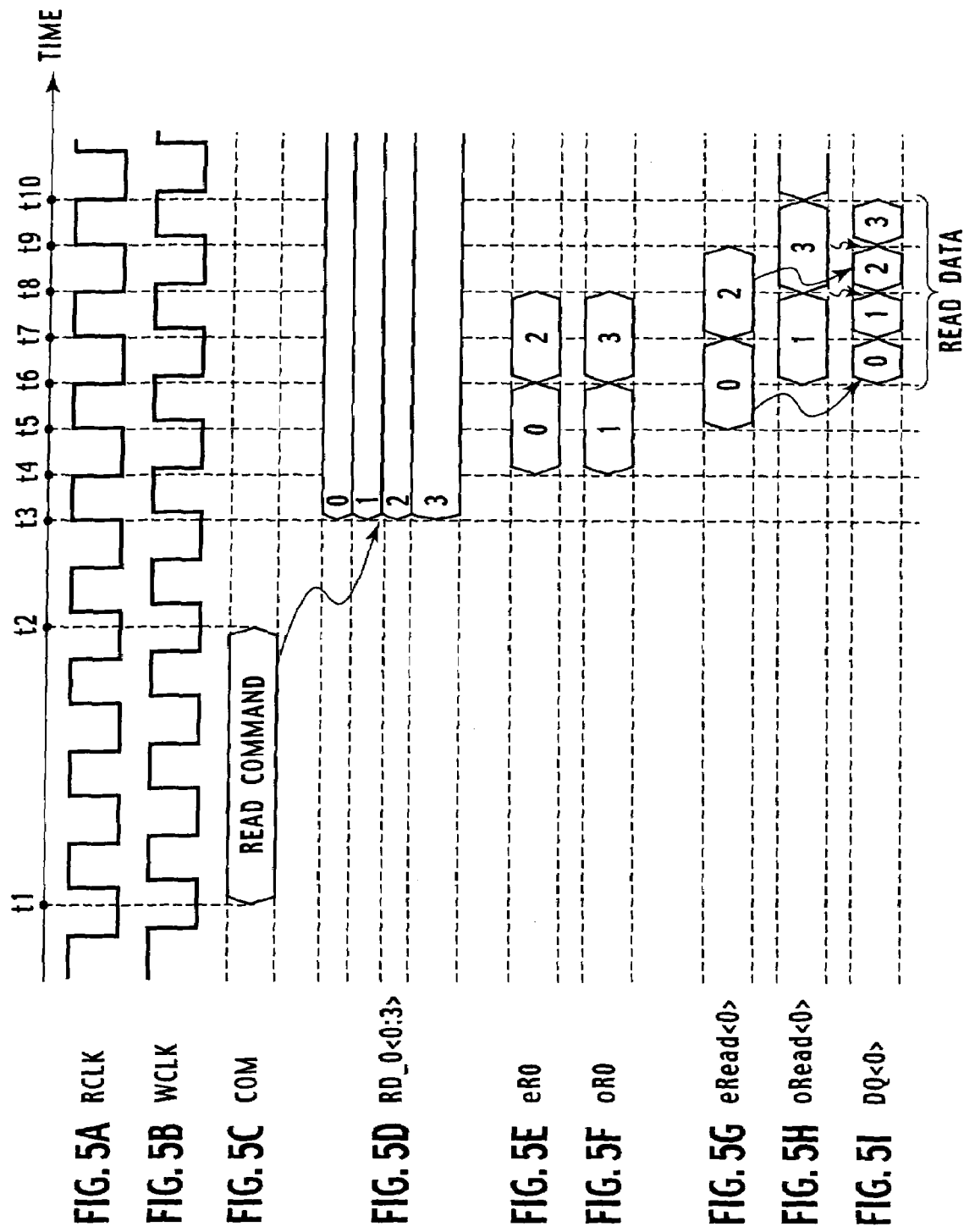
FIGS. 5A to 5I are time charts showing an operation of bit width controller according to the first embodiment of the present invention.

(A) In a period of time t1 to t2 shown in FIG. 5C, read command COM is supplied from the command bus 302 to the controller 15 in synchronization with the write clock WCLK shown in FIG. 5B. The read command has read address data for accessing the first to fourth cell arrays 16a to 16d. The controller 15 supplies the control data CTL to each circuit shown in FIG. 1 based on the read command COM.

(B) At time t3 shown in FIG. 5D, the read-data RD_0<0:3> is read out from the first cell array 16a. The first buffer 17a amplifies the read-data RD_0<0:3>, and transmits the amplified read-data to the input selector 22 and the converter 24 shown in FIG. 2.

(C) The first input multiplexer 21a shown in FIG. 2 selects the read-data RD_0<3>. The second input multiplexer 21b selects the read-data RD_0<2>. The third input multiplexer 21c selects the read-data RD_0<1>. The fourth input multiplexer 21d selects the read-data RD_0<0>.

(D) The first FF 23a shown in FIG. 2 holds the read-data RD_0<2> from the second input multiplexer 21b in synchronization with the read clock RCLK. The second FF 23b holds the read-data RD_0<0> from the fourth input multiplexer 21d in synchronization with the read clock RCLK. The fifth FF 23e holds the read-data RD_0<3> from the first input multiplexer 21a in synchronization with the read clock RCLK. The sixth FF 23f holds the read-data RD_0<1> from the third input multiplexer 21c in synchronization with the read clock RCLK. As a result, the converted read-data eR0 shown in time t4 to t8 of FIG. 5E is generated. The converted read-data oR0 shown in time t4 to t8 of FIG. 5F is generated.

(E) The first multiplexer 25a shown in FIG. 2 selects the even serial data eR0, and transmits the even serial data eR0 to the second latch circuit 27b. The second multiplexer 25b selects the odd serial data oR0, and transmits the odd serial data oR0 to the second output FF 28b.

(F) In a period of time t5 to t9 shown in FIG. 5G, the second latch circuit 27b holds the converted read-data eR0 in synchronization with leading edges of the read clock RCLK. The even read-data eRead<0> is transmitted to the first I/O circuit 13a shown in FIG. 1.

(G) In a period of time t6 to t10 shown in FIG. 5H, the second output FF 28b holds the converted read-data oR0 in synchronization with tailing edges of the read clock RCLK. The odd read-data oRead<0> is transmitted to the first I/O circuit 13a.

(H) In the period of time t6 to t10 shown in FIG. 5I, the first I/O circuit 13a selects the even read-data eRead<0> and the odd read-data oRead<0> by turns, and generates the output data DQ<0>. The output data DQ<0> is transferred to the data bus 301.

As described above, according to the first embodiment, the input selector 22 is connected to an input side of the converter 24, and the selector 26 is connected to an output side of the converter 24. That is, by dispersing the input selector 22 and the selector 26, it is possible to reduce the length of each of the wirings between the memory core 11 and the input selector 22. Especially, since the converter 24 and the output register 29 are synchronized with each other, it is possible to delete the signal delay that occurs at the selector 26 by connecting the selector 26 between the converter 24 and the output register 29.

Furthermore, it is possible to disperse the first to eighth input multiplexers 21a to 21h, by utilizing multiplexers having two inputs. Similarly, it is possible to disperse the first to sixteenth FFs 23a to 23s by utilizing eight sets of P/S converters having two inputs, such as the converter 24. As a result, it is possible to reduce the unevenness of the signal delay because it is possible to reduce each length of the wiring between the memory core 11 and the input selector 22. Accordingly, it is possible to provide a semiconductor memory capable of providing a bit width control function of the output data and performing high speed I/O operations without increasing the chip size.

(First Modification of First Embodiment)

Figure 6:
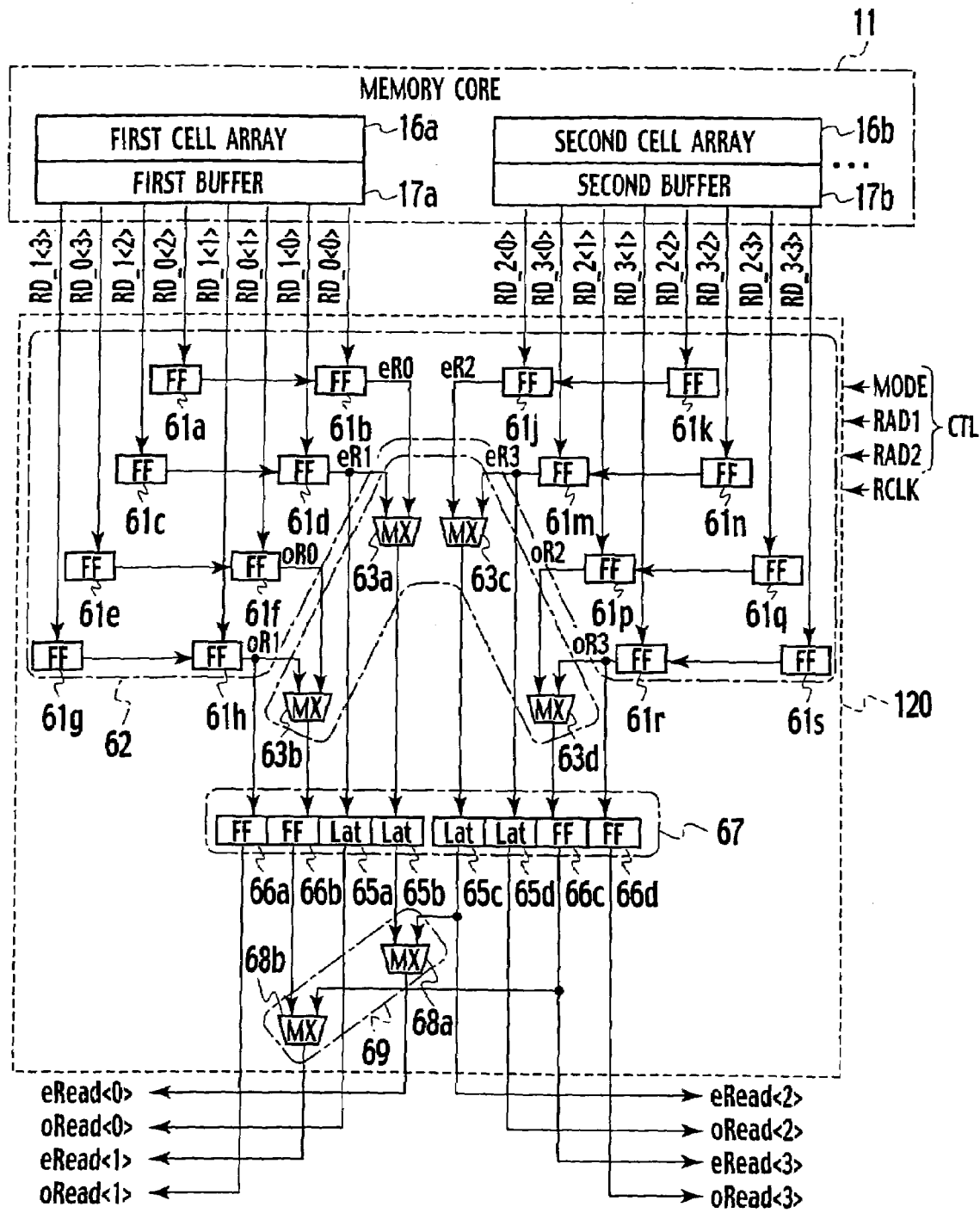
FIG. 6 is a circuit diagram showing a bit width controller according to a first modification of the first embodiment of the present invention.

As shown in FIG. 6, a first bit width controller 120 may include an output selector 69 connected to an output of the output register 67 instead of the input selector 22 shown in FIG. 2, as a semiconductor memory according to a first modification of the first embodiment of the present invention. The output selector 69 selects a bit of output data of the output register 67 of a plurality of bits of the output data, in accordance with the control data CTL. The output selector 69 includes a first output multiplexer 68a and a second output multiplexer 68b.

The selector 64 differs from FIG. 2 in that the selector 64 includes first to fourth multiplexers 63a to 63d. Each mode of the 16 bits mode, the eight bits mode, and the four bits mode is decided by select operations of the selector 64 and the output selector 69. The selector 64 switches the select operations in accordance with the mode-selecting signal MODE and the read address data RAD1. The output selector 69 switches the select operations in accordance with the mode-selecting signal MODE and the read address data RAD2.

In the 16 bits mode, the converter 62 converts the read-data RD_0<0:3> to RD_3<0:3> of 16 bits width transmitted from the first buffer 17a and the second buffer 17b into eight sets of serial data eR0, eR1, oR0, oR1, eR2, eR3, oR2, and oR3.

Each input of the first FF 61a, the third FF 61c, the fifth FF 61e, and the seventh FF 61g is connected to the first buffer 17a. Each input of the tenth FF 61k, the twelfth FF61n, the fourteenth FF 61q, and the sixteenth FF 61s is connected to the second buffer 17b.

The second FF 61b has an input connected to each output of the first FF 61a and the first buffer 17a, and an output connected to an input of the first multiplexer 63a. The converted read-data eR0 generated by the second FF 61b is supplied to the first multiplexer 63a.

The fourth FF 61d has an input connected to each output of the third FF 61c and the first buffer 17a, and output connected to each input of the first multiplexer 63a and the first latch circuit 65a. The converted read-data eR1 generated by the fourth FF 61d is supplied to the first multiplexer 63a and the first latch circuit 65a.

The sixth FF 61f has an input connected to each output of the fifth FF 61e and the first buffer 17a, and an output connected to the second multiplexer 63b. The converted read-data oR0 generated by the sixth FF 61f is supplied to the second multiplexer 63b.

The eighth FF 61h has an input connected to each output of the seventh FF 61g and the first buffer 17a, and output connected to each input of the second multiplexer 63b and the first output FF 66a. The converted read-data oR1 generated by the eighth FF 61h is supplied to the second multiplexer 63b and the first output FF 66a.

The ninth FF 61j has input connected to each output of the tenth FF 61k and the second output buffer 17b, and an output connected to an input of the third multiplexer 63c. The converted read-data eR2 generated by the ninth FF 61j is supplied to the third multiplexer 63c.

The eleventh FF 61m has an input connected to each output of the twelfth FF 61n and the second output buffer 17b, and an output connected to each input of the third multiplexer 63c and the fourth latch circuit 65d. The converted read-data eR3 generated by the eleventh FF 61m is supplied to the third multiplexer 63c and the fourth latch circuit 65d.

The thirteenth FF 61p has an input connected to each output of the fourteenth FF 61q and the second output buffer 17b, and an output connected to an input of the fourth multiplexer 63d. The converted read-data oR2 generated by the thirteenth FF 61p is supplied to the fourth multiplexer 63d.

The fifteenth FF 61r has an input connected to each output of the sixteenth FF 61s and the second output buffer 17b, and an output connected to each input of the fourth multiplexer 63d and the fourth output FF 66d. The converted read-data oR3 generated by the fifteenth FF 61r is supplied to the fourth multiplexer 63d and the fourth output FF 66d.

Furthermore, the first multiplexer 63a has an output connected to an input of the second latch circuit 65b. The second multiplexer 63b has an output connected to an input of the second output FF 66b. The third multiplexer 63c has an output connected to an input of the third latch circuit 65c. The fourth multiplexer 63d has an output connected to an input of the third output FF 66c.

When the 16 bits mode is selected by the mode-selecting signal MODE, the first multiplexer 63a selects the converted read-data eR0 regardless of the read address data RAD1. Similarly, the second multiplexer 63b selects the converted read-data oR0. The third multiplexer 63c selects the converted read-data eR2. The fourth multiplexer 63d selects the converted read-data oR2.

On the other hand, when the eight bits mode or the four bits mode is selected by the mode selecting signal MODE, the first to fourth multiplexers 63a to 63d switch the select operation in accordance with the read address data RAD1 as shown in FIG. 7. For example, in the eight bits mode or the four bits mode, the first multiplexer 63a selects the converted read-data eR0 when the read address data AD1 is a logic value "0", and selects the converted read-data eR1 when the read address data AD1 is a logic value "1".

The first output multiplexer 68a has an input connected to each output of the second latch circuit 65b and the third latch circuit 65c, and an output connected to an input of the I/O circuit 13a shown in FIG. 1. The second output multiplexer 68b has an input connected to each output of the second FF 66b and the third FF 66c, and an output connected to an input of the I/O circuit 13a.

When the 16 bits mode or the eight bits mode is selected by the mode-selecting signal MODE, the first output multiplexer 68a selects output data of the second latch circuit 65b regardless of the read address data RAD2. The second output multiplexer 68b selects output data of the second FF 66b.

On the other hand, when the four bits mode is selected by the mode selecting signal MODE, the first output multiplexer 68a and the second output multiplexer 68b switch the select operation in accordance with the read address data RAD2 as shown in FIG. 8. For example, in the four bits mode, first output multiplexer 68a selects the output data of the second latch circuit 65b when the read address data RAD2 is a logic value "0", and selects the converted read-data eRead<2> when the read address data RAD2 is a logic value "1".

As described above, regarding the semiconductor memory according to the first modification of the first embodiment, the selector 64 is connected between the converter 62 and the output register 67, and the output selector 69 is connected between the output register 67 and the first I/O circuit 13a shown in FIG. 1. Accordingly, it is possible to delete the signal delay that occurs at the selector 64 and the output selector 69.

(Second Modification of First Embodiment)

Figure 9:
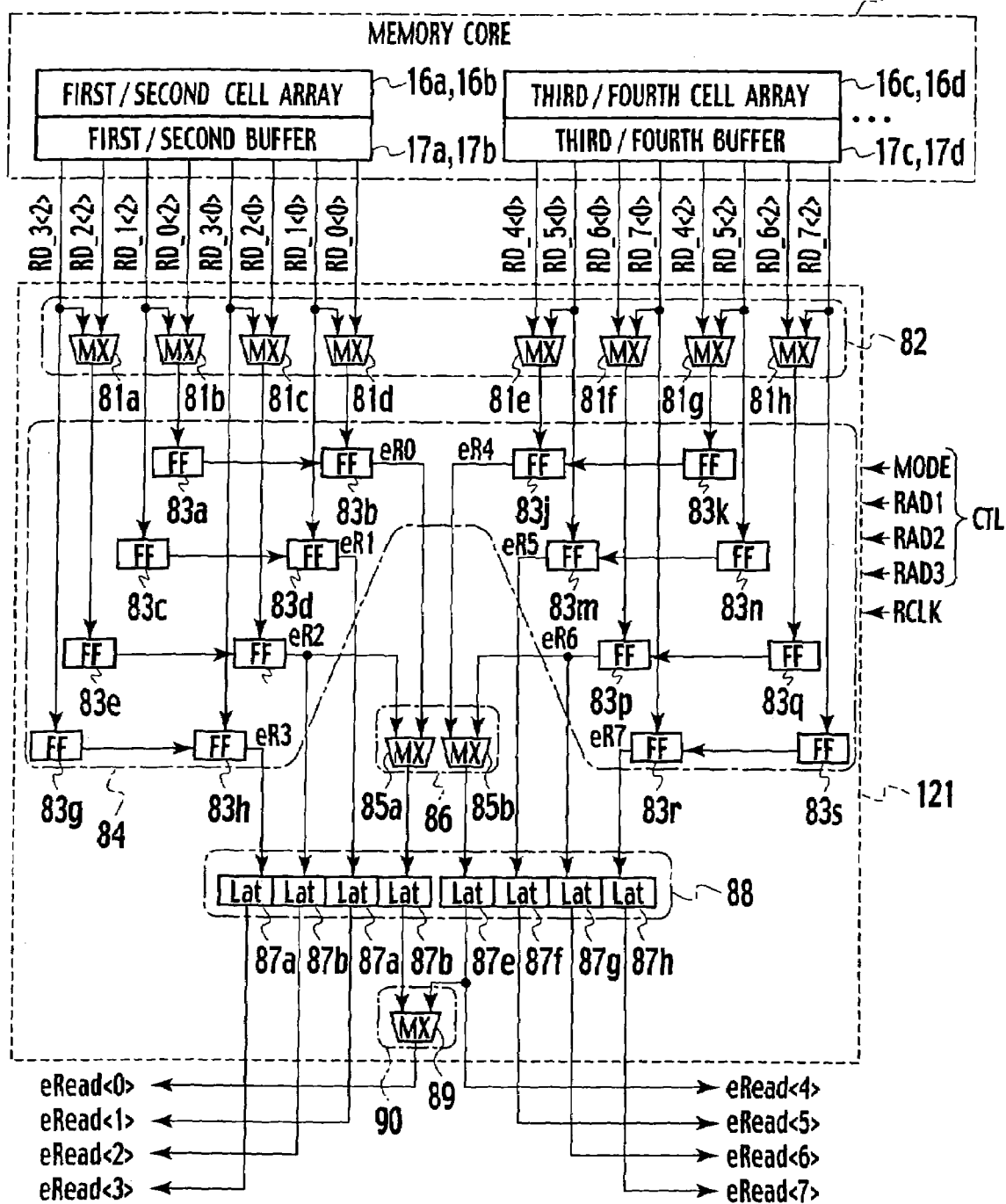
FIG. 9 is a circuit diagram showing a bit width controller according to a second modification of the first embodiment of the present invention.

As shown in FIG. 9, a first bit width controller 121 may control even read-data RD_0<0> to RD_7<0> and RD_0<2> to RD_7<2> of the read-data RD_0<0:3> to RD_7<0:3> from the memory core 11, as a semiconductor memory according to second modification of the first embodiment of the present invention. In this case, the second bit width controller 12b shown in FIG. 1 controls odd read-data RD_0<1> to RD_7<1> and RD_0<3> to RD_7<3> of the read-data RD_0<0:3> to RD_7<0:3>. Furthermore, the bit width of entire semiconductor memory is set to one of 16 bits, eight bits, four bits, and two bits.

As shown in FIG. 9, the first bit width controller 121 differs from FIG. 2 in that the first bit width controller 121 further includes an output selector 90 connected to an output of the output register 88. The output register 88 differs from FIG. 2 in that the output register 88 includes first to eighth latch circuits 87a to 87h. The selector 86 includes a first multiplexer 85a and a second multiplexer 85b. Each mode of the 16 bits mode, the eight bits mode, the four bits mode, and the two bits mode is switched by select operations of the input selector 82, the selector 86, and the output selector 90.

The input selector 82 switches the select operation in accordance with the mode-selecting signal MODE and the read address data RAD1. The selector 86 switches the select operation in accordance with the mode-selecting signal MODE and the read address data RAD2. The output selector 90 switches the select operation in accordance with the mode selecting signal MODE and the read address data RAD3.

The first input multiplexer 81a selects one of the read-data RD_2<2> and RD_3<2> in accordance with the mode-selecting signal MODE and the read address data RAD1. The second input multiplexer 81b selects one of the read-data RD_0<2> and RD_1<2> in accordance with the mode-selecting signal MODE and the read address data RAD1. The third input multiplexer 81c selects one of the read-data RD_2<0> and RD_3<0> in accordance with the mode-selecting signal MODE and the read address data RAD1. The fourth input multiplexer 81d selects one of the read-data RD_0<0> and RD_1<0> in accordance with the mode-selecting signal MODE and the read address data RAD1. The fifth input multiplexer 81e selects one of the read-data RD_4<0> and RD_5<0> in accordance with the mode-selecting signal MODE and the read address data RAD1. The sixth input multiplexer 81f selects one of the read-data RD_6<0> and RD_7<0> in accordance with the mode-selecting signal MODE and the read address data RAD1. The seventh input multiplexer 81g selects one of the read-data RD_4<2> and RD_5<2> in accordance with the mode-selecting signal MODE and the read address data RAD1. The eighth input multiplexer 81h selects one of the read-data RD_6<2> and RD_7<2> in accordance with the mode-selecting signal MODE and the read address data RAD1.

When the 16 bits mode is selected by the mode-selecting signal MODE, the first input multiplexer 81a selects the read-data RD_2<2> regardless of the read address data RAD1. Similarly, the second input multiplexer 81b selects the read-data RD_0<2>. The third input multiplexer 81c selects the read-data RD_2<0>. The fourth input multiplexer 81d selects the read-data RD_0<0>. The fifth input multiplexer 81e selects the read-data RD_4<0>. The sixth input multiplexer 81f selects the read-data RD_6<0>. The seventh input multiplexer 81g selects the read-data RD_4<2>. The eighth input multiplexer 81h selects the read-data RD_6<2>.

On the other hand, the eight bits mode, the four bits mode, or the two bits mode is selected by the mode-selecting signal MODE, the first to eighth input multiplexers 81a to 81h switch the select operations in accordance with the read address data RAD1 as shown in FIG. 10. For example, in the eight bits mode, the four bits mode, or the two bits mode, the first input multiplexer 81a selects the read-data RD_2<2> when the read address data AD1 is a logic value "0", and selects the read-data RD_3<2> when the read address data AD1 is a logic value "1".

In the 16 bits mode, the converter 84 converts the read-data RD_0<0:3> to RD_3<0:3> of 16 bits width into eight sets of serial data eR0 to eR7. In the 16 bits mode, first FF 83a and second FF 83b hold the read-data RD_0<0> and RD_0<2> in synchronization with the read clock RCLK. The held read-data RD_0<0> and RD_0<2> is transmitted to the first multiplexer 85a as the converted read-data eR0.

The third FF 83c and fourth FF 83d hold the read-data RD_1<0> and RD_1<2> in synchronization with the read clock RCLK. The held read-data RD_1<0> and RD_1<2> is transmitted to the third latch circuit 87c as the converted read-data eR1.

In the 16 bits mode, the fifth FF 83e and the sixth FF 83f hold the read-data RD_2<0> and RD_2<2> in synchronization with the read clock RCLK. The held read-data RD_2<0> and RD_2<2> is transmitted to the first multiplexer 85a and the second latch circuit 87b as the converted read-data eR2.

The seventh FF 83g and the eighth FF 83h hold the read-data RD_3<0> and RD_3<2> in synchronization with the read clock RCLK. The held read-data RD_3<0> and RD_3<2> is transmitted to the first latch circuit 87a as the converted read-data eR3.

In the 16 bits mode, the ninth FF 83j and the tenth FF 83k hold the read-data RD_4<0> and RD_4<2> in synchronization with the read clock RCLK. The held read-data RD_4<0> and RD_4<2> is transmitted to the second multiplexer 85b as the converted read-data eR4.

The eleventh FF 83m and the twelfth FF 83n hold the read-data RD_5<0> and RD_5<2> in synchronization with the read clock RCLK. The held read-data RD_5<0> and RD_5<2> is transmitted to the sixth latch circuit 87f as the converted read-data eR5.

In the 16 bits mode, the thirteenth FF 83p and the fourteenth FF 83q hold the read-data RD_6<0> and RD_6<2> in synchronization with the read clock RCLK. The held read-data RD_6<0> and RD_6<2> is transmitted to the second multiplexer 85b and the seventh latch circuit 87g as the converted read-data eR6.

The fifteenth FF 83r and sixteenth FF 83s hold the read-data RD_7<0> and RD_7<2> in synchronization with the read clock RCLK. The held read-data RD_7<0> and RD_7<2> is transmitted to the eighth latch circuit 87h as the converted read-data eR7.

The first multiplexer 85a has an input connected to each output of the second FF 83b and the sixth FF 83f, and an output connected to an input of the fourth latch circuit 87d. The second multiplexer 85b has an input connected to each output of the ninth FF 83j and the thirteenth FF 83p, and an output connected to the fifth latch circuit 87e.

When the 16 bits mode or the eight bits mode is selected by the mode selecting signal MODE, the first multiplexer 85a selects the converted read-data eR0 regardless of the read address data RAD2. Similarly, the second multiplexer 85b selects the converted read-data eR4.

On the other hand, the four bits mode or the two bits mode is selected by the mode selecting signal MODE, the first multiplexer 85a selects one of the converted read-data eR0 and eR0 in accordance with the read address data RAD2 as shown in FIG. 11. Similarly, the second multiplexer 85b selects one of the converted read-data eR4 and eR6 in accordance with the read address data RAD2. For example, in the four bits mode and the two bits mode, first multiplexer 85a selects the converted read-data eR0 when the read address data AD2 is a logic value "0", and selects the converted read-data eR2 when the read address data AD2 is a logic value "1".

The output selector 90 includes an output multiplexer 89 having an input connected to each output of the fourth latch circuit 87d and the fifth latch circuit 87e. When the 16 bits mode, the eight bits mode, and the four bits mode are selected by the mode-selecting signal MODE, the output multiplexer 89 selects output data of the fourth latch circuit 87d.

On the other hand, when the two bits mode is selected by the mode-selecting signal MODE, the output multiplexer 89 selects one output data of the fourth latch circuit 87d and the fifth latch circuit 87e in accordance with the read address data RAD3. In the two bits mode, the output multiplexer 89 selects output data of the fourth latch circuit 87d when the read address data AD3 is a logic value "0", and selects output data of the fifth latch circuit 87e, i.e., the converted read-data eRead<4> when the read address data AD3 is a logic value "1".

As described above, the semiconductor memory according to the second modification of the first embodiment separately controls the even read-data RD_0<0> to RD_7<0> and RD_0<2> to RD_7<2>, and the odd read-data RD_0<1> to RD_7<1> and RD_0<3> to RD_7<3> of the read-data RD_0<0:3> to RD_7<0:3> read from the memory core 11 shown in FIG. 1. It is possible to provide four patterns of the bit width, i.e., 16 bits, eight bits, four bits, and two bits by including the input selector 82, the selector 86, and the output selector 90.

(Third Modification of First Embodiment)

Figure 12:
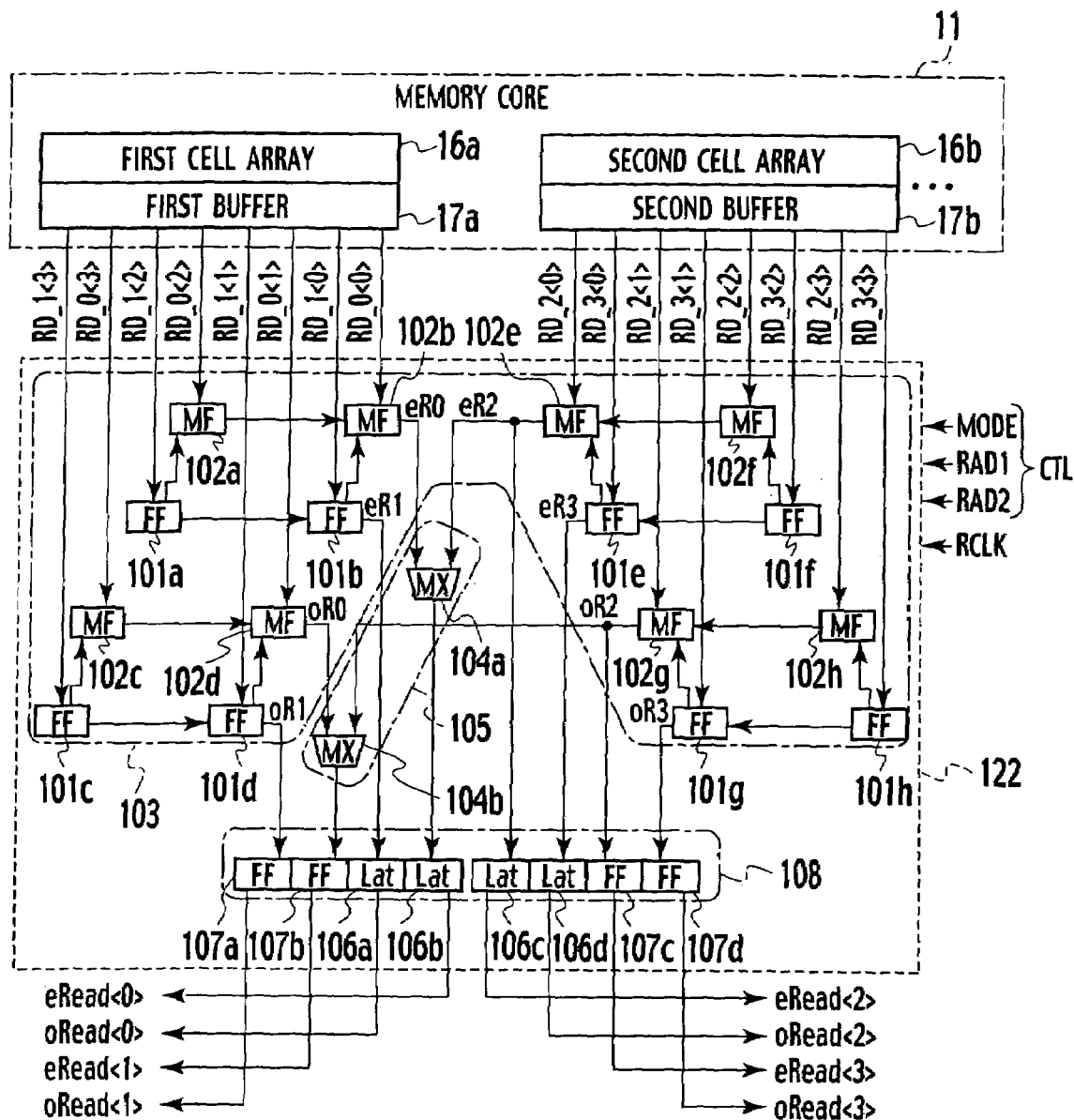
FIG. 12 is a circuit diagram showing a bit width controller according to a third modification of the first embodiment of the present invention.

A semiconductor memory according to a third modification of the first embodiment of the present invention employs arrangements incorporating the functions of the input selector 22 shown in FIG. 2 into the converter 24. That is, a first bit width controller 122 according to the third modification of the first embodiment differs from FIG. 2 in that a converter 103 has a different arrangement with the converter 24 as shown in FIG. 12. The converter 103 selects a bit of the read-data of the plurality of bits of the read-data RD_0<0:3> to RD_3<0:3>, in accordance with the control data CTL, and converts the selected read-data into the serial data, and generates the converted read-data. Other arrangements are similar to FIG. 2.

The converter 103 includes first to eighth FFs 101a to 101h, and first to eighth multiplexing FFs (hereinafter referred to as "MF") 102a to 102h. The first to eighth FFs 101a to FF 101h and first to eighth MFs 102a to 102h arrange eight sets of two bit P/S converters. The eight sets of two bit P/S converters have inputs connected to outputs of the first buffer 17a and the second buffer 17b, and outputs connected to the selector 105 and the output register 108.

In the 16 bits mode, the converter 103 converts the read-data of 16 bits transmitted from the first buffer 17a and the second buffer 17b into eight sets of converted read-data eR0, eR1, oR0, oR1, eR2, eR3, oR2, and oR3.

Furthermore, the first to eighth MFs 102a to 102h have selecting inputs connected to intermediate output of the first to eighth FFs 101a to 101h, respectively. The first MF 102a has an input connected to the first buffer 17a. The second MF102b has inputs connected to the first buffer 17a and the first MF 102a. The converted read-data eR0 generated by the second MF 102b is supplied to the first multiplexer 104a.

The first FF 101a has an input connected to the output of the first buffer 17a. The second FF 101b has inputs connected to each output of the first buffer 17a and the first FF 101a. The converted read-data eR1 generated by the second FF 101b is supplied to the first latch circuit 106a.

The third MF 102c has an input connected to the output of the first buffer 17a. The fourth MF 102d has inputs connected to each output of the third MF 102c and the first buffer 17a. The converted read-data oR0 generated by the fourth MF102d is supplied to the second multiplexer 104b.

The third FF 101c has an input connected to the output of the first buffer 17a. The fourth FF101d has inputs connected to each output of the third FF101c and the first buffer 17a. The converted read-data oR1 generated by the fourth FF 101d is supplied to the first output FF107a.

The sixth MF 102f has an input connected to the output of the second buffer 17b. The fifth MF102e has inputs connected to each output of the sixth MF102f and the second buffer 17b. The converted read-data eR2 generated by he fifth MF102e is supplied to the first multiplexer 104a and the third latch circuit 106c.

The sixth FF 101f has an input connected to the output of the second buffer 17b. The fifth FF101e has inputs connected to each output of the sixth FF101f and the second buffer 17b. The converted read-data eR3 generated by the fifth FF101e is supplied to the fourth latch circuit 106d.

The eighth MF 102h has an input connected to the output of the second buffer 17b. The seventh MF 102g has inputs connected to each output of the eighth MF102h and the second buffer 17b. The converted read-data oR2 generated by the seventh MF 102g is supplied to the second multiplexer 104b and the third output FF107c.

The eighth FF 101h has an input connected to the output of the second buffer 17b. The seventh FF 101g has inputs connected to each output of the eighth FF101h and the second buffer 17b. The converted read-data oR3 generated by the seventh FF101g is supplied to the fourth output FF 107d.

Furthermore, the arrangements of the first MF 102a, the second MF102b, the first FF101a, and the second FF101b are shown in FIG. 12. The arrangements of the third to eighth MFs 102c to 102h and the third to eighth FFs 101c to 101h are similar to FIG. 12.

The first MF 102a includes an input switch circuit 111a, a master latch circuit (hereinafter referred to as "ML") 113a, a first input multiplexer 114a, a shift switch circuit 115a, and a slave latch circuit (hereinafter referred to as "SL") 116a. The input switch circuit 111a takes in the read-data RD_0<1> in synchronization with a load signal LOAD. The ML 113a includes inverters 112a and 112b. The first input multiplexer 114a switches the bit width of the I/O data. The shift switch circuit 115a transfers data from the master stage to the slave stage in synchronization with the read clock RCLK. The SL 116a includes inverters 112c and 112d.

The second MF 102b includes input switch circuits 117a and 111b, an ML 113b, a second input multiplexer 114b, a shift switch circuit 115b, and an SL 116b. The input switch circuit 117a takes in data from the first MF 102a in synchronization with an inverted read clock RCLKb. The input switch circuit 111b takes in the read-data RD_0<0> in synchronization with the load signal LOAD. The ML 113b includes inverters 112e and 112f. The second input multiplexer 114b switches the bit width of the I/O data. The shift switch circuit 115b transfers data from the master stage to the slave stage in synchronization with the read clock RCLK. The SL 116b includes inverters 112g and 112h.

The first FF 101a includes an input switch circuit 111c, an ML 113c, a shift switch circuit 115c, and an SL 116c. The input switch circuit 111c takes in the read-data RD_1<1> in synchronization with the load signal LOAD. The ML 113c includes inverters 112j and 112k. The shift switch circuit 115c transfers data from the master stage to the slave stage in synchronization with the read clock RCLK. The SL 116c includes inverters 112m and 112n.

The second FF 101b includes input switch circuits 117b and 111d, an ML 113d, a shift switch circuit 115d, and an SL 116d. The input switch circuit 117b takes in data from first FF 101a in synchronization with the inverted read clock RCLKb. The input switch circuit 111d takes in the read-data RD_1<0> in synchronization with the load signal LOAD. The ML 113d includes inverters 112p and 112q. The shift switch circuit 115d transfers data from the master stage to the slave stage in synchronization with the read clock RCLK. The SL 116d includes inverters 112r and 112s.

The first input multiplexer 114a having two inputs and an output is connected between the master stage and the slave stage of the first MF 102a. The second input multiplexer 114b having two inputs and an output is connected between the master stage and the slave stage of the second MF 102b. The first input multiplexer 114a selects one of data from the master stage and the data from the first FF 101a. The second input multiplexer 114b selects one of data from the master stage and the data from the second FF 101b.

The first input multiplexer 114a has one input connected to an output of the ML 113a, and another input connected to an output of the ML 113c of the first FF101a. The data selected by the first input multiplexer 114a is supplied to the SL 116a via the shift switch circuit 115a.

The second input multiplexer 114b has an input connected to an output of the ML 113b, and another input connected to an output of the ML 113d of the second FF 101b. The data selected by the second multiplexer 114b is supplied to the SL 116b via the shift switch circuit 115b.

The first input multiplexer 114a and the second input multiplexer 114b switch the select operation in accordance with the mode selecting signal MODE and the read address data RAD1. In the 16 bits mode, the first input multiplexer 114a selects the output data of the ML 113a regardless of the read address data RAD1. In the 16 bits mode, the second multiplexer 114b selects the output data of the ML 113b.

Figures 13, 14:
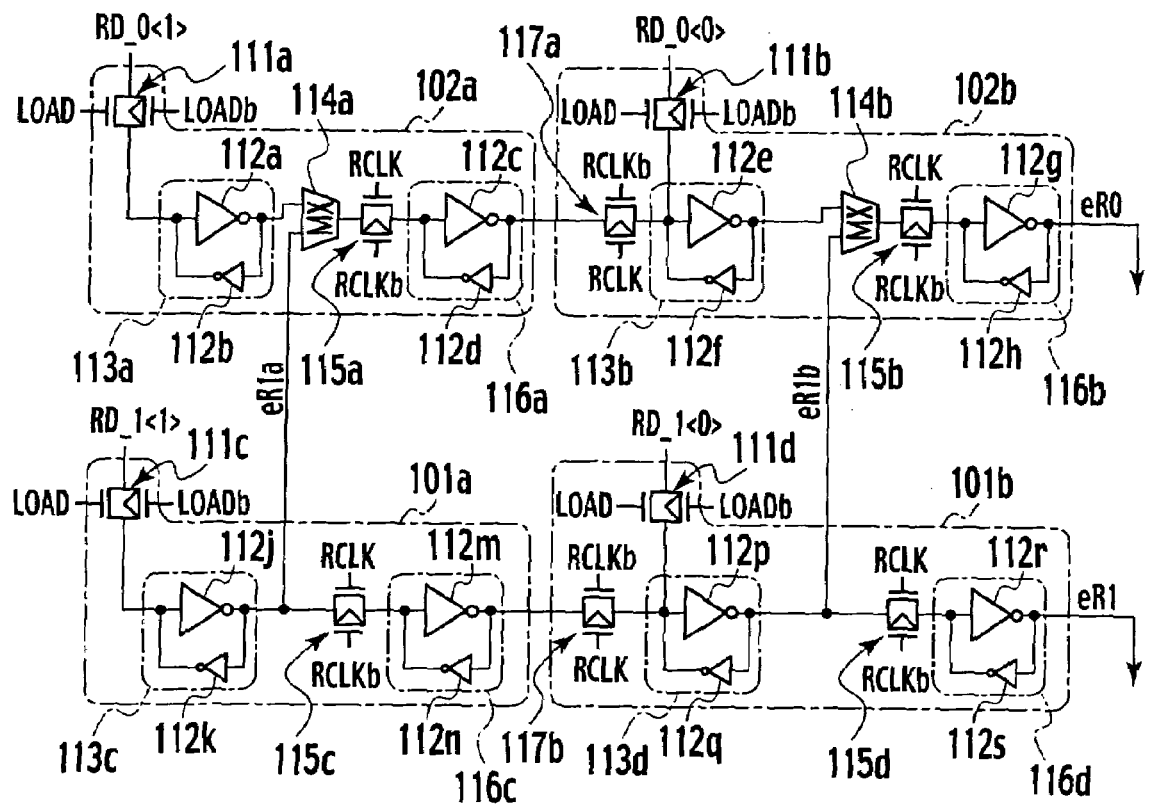
FIG. 13 is a circuit diagram showing a converter according to the third modification of the first embodiment of the present invention.
FIG. 14 is a table showing an operation of first and second input multiplexers in four bits mode and two bits mode according to the third modification of the first embodiment of the present invention.

In the eight bits mode or the four bits mode, the first input multiplexer 114a and the second input multiplexer 114b switch the select operation in accordance with the read address data RAD1 as shown in FIG. 14. For example, in the eight bits mode or the four bits mode, the first input multiplexer 114a selects the output data of the ML 113a when the read address data RAD1 is a logic value "0", and selects read-data eR1a when the read address data RAD1 is a logic value "1".

As described above, regarding the semiconductor memory according to the third modification of the first embodiment, it is possible to provide a semiconductor memory capable of increasing the operation speed and decreasing the circuit size, by adding the select function to the converter 103. Therefore, the third modification of the first embodiment is effective when layout area of circuit elements is smaller than layout area of wirings, such as a semiconductor memory having a large capacity.

(Second Embodiment)

Figure 15:
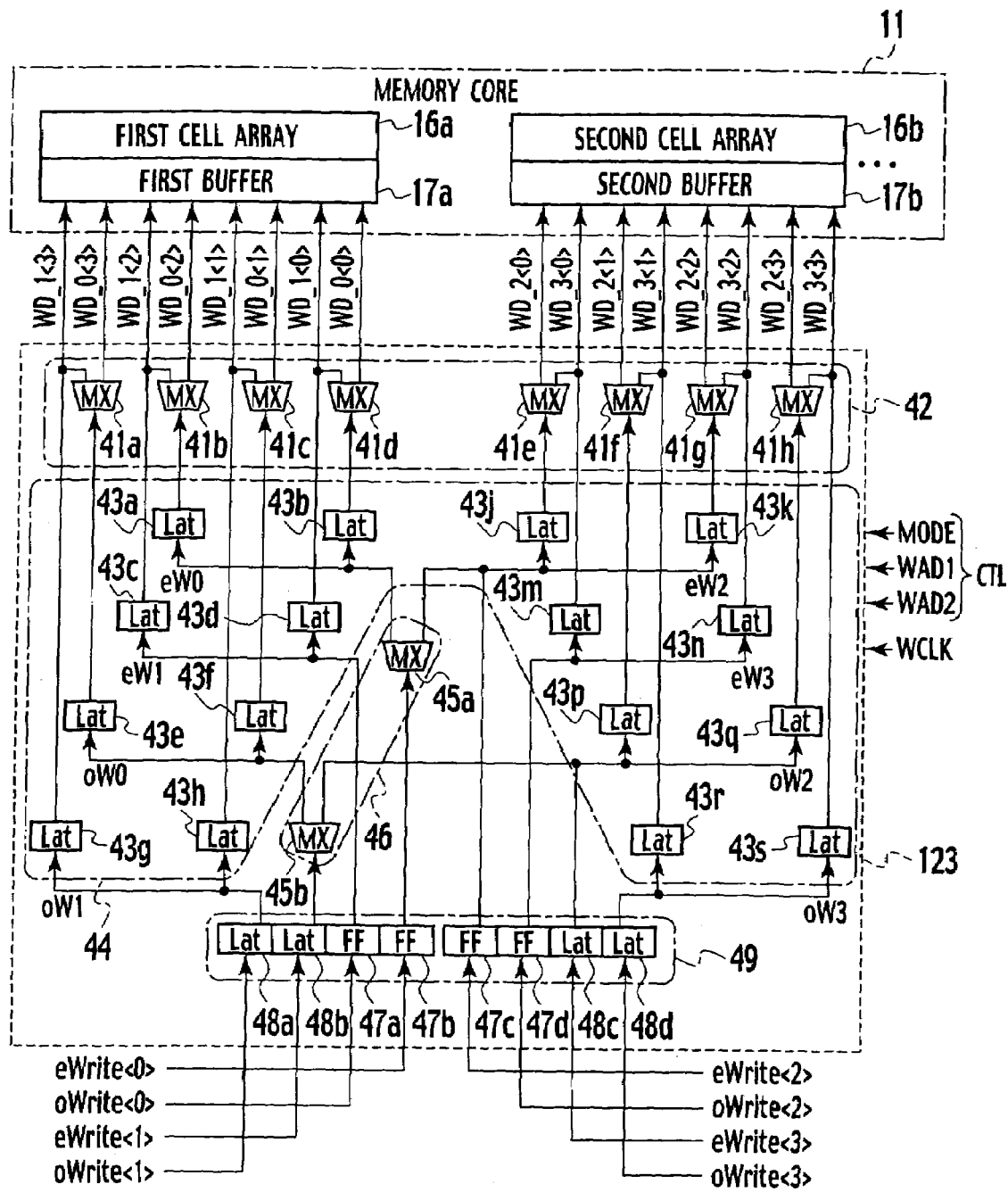
FIG. 15 is a circuit diagram showing a bit width controller according to the second embodiment of the present invention.

As shown in FIG. 15, a semiconductor memory according to a second embodiment of the present invention includes an input register 49, a distributor 46, a converter 44, and an output distributor 42. The input register 49 holds write-data eWrite and oWrite in synchronization with the write clock WCLK. The converter 44 converts each bit of the write-data eWrite and oWrite held by the input register 49 into parallel data, and supplies the parallel data to the memory core 1. The distributor 46 distributes the held write-data to the converter 44 in accordance with control data CTL, and increases the bit width of the write-data eWrite and oWrite in accordance with the control data CTL. The output distributor 42 distributes the converted write-data to the memory core 11 in accordance with the control data CTL, and increases the bit width of the write-data eWrite and oWrite in accordance with the control data CTL. Other arrangements are similar to the semiconductor memory shown in FIG. 1 and FIG. 2.

Each mode of the 16 bits mode, the eight bits mode, and the four bits ode is achieved by switching the distribution operations of the distributor 46 and the output distributor 42. The switch of the distribution operations of the distributor 46 and the output distributor 42 is perfomed before transmitting the write-data eWrite<0:3> and oWrite<0:3> from the first I/O circuit 13a shown in FIG. 1. The mode selecting signal MODE, and the write address WAD1 and WAD1 is used as the control data CTL.

In the four bits mode, the write-data eWrite<0> and oWrite<0> is transmitted to the input register 49 from the first I/O circuit 13a shown in FIG. 1. In the eight bits mode, the write-data eWrite<0:1> and oWrite<0:1> is transmitted to the input register 49 from the first I/O circuit 13a. In 16 bits mode, the write-data eWrite<0:3> and oWrite<0:3> is transmitted to the input register 49 from the first I/O circuit 13a.

In the 16 bits mode, the first I/O circuit 13a shown in FIG. 1 receives the input data DQ<0> to DQ<3> from the data bus 301 in synchronization with the write clock WCLK, and generates the write-data eRead<0:3> and oWrite<0:3> by a serial-parallel (S/P) conversion. The first I/O circuit 13a divides the input data DQ<0> to DQ<3> into write-data eRead<0:3> having even bits (hereinafter referred to as "even write-data") and write-data oRead<0:3> having odd bits (hereinafter referred to as "odd write-data"). Here, the even write-data eWrite<0:3> and the odd write-data oWrite<0:3> is shifted by a half clock cycle of the write clock WCLK.

The input register 49 shown in FIG. 15 includes first to fourth input latch circuits 48a to 48d, and first to fourth FFs 47a to FF 47d. The distributor 46 includes a first demultiplexer 45a and a second demultiplexer 45b. The converter 44 includes first to sixteenth latch circuits 43a to 43s. The output distributor 42 includes first to eighth output demultiplexers 41a to 41h.

The even write-data eWrite<0:3> is supplied to the first to fourth FFs 7a to 47d. The odd write-data oWrite<0:3> is supplied to the first to fourth input latch circuits 48a to 48d. As a result, each phase of the even write-data eWrite<0:3> and the odd write-data oWrite<0:3> is synchronized, and eight sets of serial data eW0, eW1, oW0, oW1, eW2, eW3, oW2, and oW3 are generated.

The first to sixteenth latch circuits 43a to 43s arranges eight sets of two bits S/P converters. In the 16 bits mode, the converter 44 converts the eight sets of serial data eW0, eW1, oW0, oW1, eW2, eW3, oW2, and oW3 transmitted by the distributor 46 and the input register 49 into write-data WD_0<0:3> to WD_3<0:3> of 16 bits by S/P conversion.

Furthermore, the first demultiplexer 45a has an input connected to an output of the second FF 47b. The second demultiplexer 45b has an input connected to an output of the second input latch circuit 48b. When the 16 bits mode or the eight bits mode is selected by the mode-selecting signal MODE, the first demultiplexer 45a transmits output data of the second FF 47b to the first latch circuit 43a and the second latch circuit 43b regardless of the write address RAD1. In the 16 bits mode or the eight bits mode, the second demultiplexer 45b transmits output data of the second input latch circuit 48b to the fifth latch circuit 43e and the sixth latch circuit 43f.

When the four bits mode is selected by the mode-selecting signal MODE, the first demultiplexer 45a and the second demultiplexer 45b switch the distribution operations in accordance with the write address data WAD1 as shown in FIG. 16. In the four bits mode, the first demultiplexer 45a supplies the serial data eW0 to the first latch circuit 43a and the second latch circuit 43b when the write address WAD1 is a logic value "0". On the other hand, the first demultiplexer 45a supplies the serial data eW2 to the ninth latch circuit 43j and he tenth latch circuit 43k when the write address WAD1 is a logic value "1".

The first latch circuit 43a and the second latch circuit 43b have inputs connected to an output of the first demultiplexer 45a. The third latch circuit 43c and the fourth latch circuit 43d have inputs connected to an output of the first FF 47a. The fifth latch circuit 43e and the sixth latch circuit 43f have inputs connected to an output of the second demultiplexer 45b. The seventh latch circuit 43g and the eighth latch circuit 43h have inputs connected to an output of the first input latch circuit 48a.

The ninth latch circuit 43j and the tenth latch circuit 43k have inputs connected to outputs of the first demultiplexer 45a and the third FF 47c. The eleventh latch circuit 43m and the twelfth latch circuit 43n have inputs connected to an output of the fourth FF 47d. The thirteenth latch circuit 43p and the fourteenth latch circuit 43q have inputs connected to outputs of the second demultiplexer 45b and the third input latch circuit 48c. The fifteenth latch circuit 43r and the sixteenth latch circuit 43s have inputs connected to an output of the fourth input latch circuit 48d.

The first output demultiplexer 41a has an input connected to an output of the fifth latch circuit 43e. The second output demultiplexer 41b has an input connected to an output of the first latch circuit 43a. The third output demultiplexer 41c has an input connected to an output of the sixth latch circuit 43f. The fourth output demultiplexer 41d has an input connected to an output of the second latch circuit 43b.

The fifth output demultiplexer 41e has an input connected to an output of the ninth latch circuit 43j. The sixth output demultiplexer 41f has an input connected to an output of the thirteenth latch circuit 43p. The seventh output demultiplexer 41g has an input connected to an output of the tenth latch circuit 43k. The eighth output demultiplexer 41h has an input connected to an output of the fourteenth latch circuit 43q.

Furthermore, the first output demultiplexer 41a supplies the write-data WD_0<3> to the first buffer 17a regardless of the write address WAD2 when the 16 bits mode is selected by the mode-selecting signal MODE. Similarly, the second output demultiplexer 41b supplies the write-data WD_0<2> to the first buffer 17a. The third output demultiplexer 41c supplies the write-data WD_0<1> to the first buffer 17a. The fourth output demultiplexer 41d supplies the write-data WD_0<0> to the first buffer 17a. The fifth output demultiplexer 41e supplies the write-data WD_2<0> to the second buffer 17b. The sixth output demultiplexer 41f supplies the write-data WD_2<1> to the second buffer 17b. The seventh output demultiplexer 41g supplies the write-data WD_2<2> to the second buffer 17b. The eighth output demultiplexer 41h supplies the write-data WD_2<3> to the second buffer 17b.

The first to eighth output demultiplexers 41a to 41h switches the distribution operation in accordance with the write address WAD2 when the eight bits mode or the four bits mode is selected by the mode selecting signal MODE, as shown in FIG. 17. For example, in the eight bits mode or the four bits mode, the first output demultiplexer 41a supplies the output data of the fifth latch circuit 43e to the first buffer 17a as write-data WD_0<3> when the write address WAD2 is a logic value "0", and supplies the output data of the fifth latch circuit 43e to the first buffer 17a as write-data WD_1<3> when the write address WAD2 is a logic value "1"

Next, the operation of the semiconductor memory according to the second embodiment of the present invention will be described referring to time charts shown in FIG. 18A to FIG. 18K. The case of writing data D<0> supplied to the first I/O terminal 2a shown in FIG. 1 to the first cell array 16a will be described.

Figure 18:
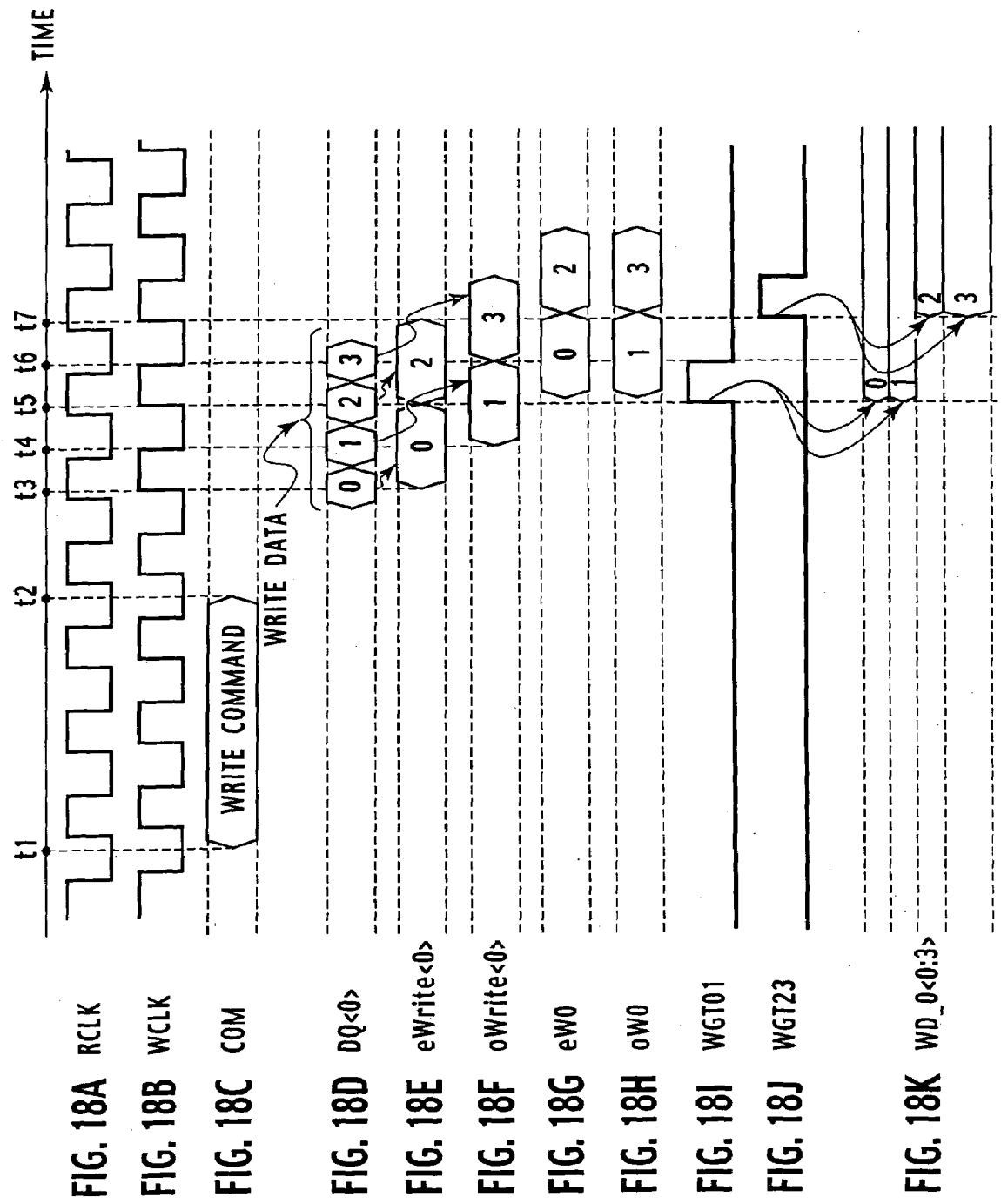
FIGS. 18A to 18K are time charts showing an operation of the bit width controller according to the second embodiment of the present invention.

(A) In a period of time t1 to t2 shown in FIG. 18C, write command COM is supplied to the controller 15 shown in FIG. 1 from the command bus 302 in synchronization with the write clock WCLK shown in FIG. 18B. The write command COM includes write address data for accessing the first to fourth cell arrays 16a to 16d.

(B) The four bits serial write-data DQ<0> shown in FIG. 18D is converted into two bits of serial data shifted by half clock cycle of the write clock WCLK by the first I/O circuit 13a. As a result, even write-data eWrite<0> shown in FIG. 18E and odd write-data oWrite<0> shown in FIG. 18F is generated.

(C) The even write-data eWrite<0> and the odd write-data oWrite<0> are subjected to a timing adjustment by the input register 49. Moreover, two sets of serial data eW0 and oW0 shown in FIG. 18G and FIG. 18H are generated in synchronization with the write clock WCLK.

(D) The first bit "0" in the serial data eW0 is took in the second latch circuit 43b in synchronization with leading edges of a latch signal WGT01 shown in FIG. 18I. As a result, write-data WD_0<0> shown in FIG. 18K is generated. The latch signal WGT01 is a signal synchronized with the write clock WCLK, and is generated by the controller 15 shown in FIG. 1. Furthermore, the first bit "1" in the serial data oW0 is took in the sixth latch circuit 43f in synchronization with leading edges of a latch signal WGT01. Therefore, write-data WD_0<1> shown in FIG. 18K is generated.

(E) The second bit "2" in the serial data eW0 is took in the first latch circuit 43a in synchronization with leading edges of a latch signal WGT23 shown in FIG. 18J. As a result, write-data WD_0<2> shown in FIG. 18K is generated. The latch signal WGT23 is a signal delayed by a clock cycle of the write clock WCLK from the latch signal WGT01, and is generated by the controller 15. The second bit "3" in the serial data oW0 is took in the fifth latch circuit 43e in synchronization with leading edges of the latch signal WGT23. As a result, write-data WD_0<3> shown in FIG. 18K is generated.

The write-data WD_0<0:3> is wrote to the first cell array 16a by the first buffer 17a.

As described above, regarding the second embodiment, it is possible to provide a semiconductor memory capable of providing a bit width control function of the input data and performing high speed I/O operations without increasing the chip size, as same as the first embodiment.

(First Modification of Second Embodiment)

Figure 19:
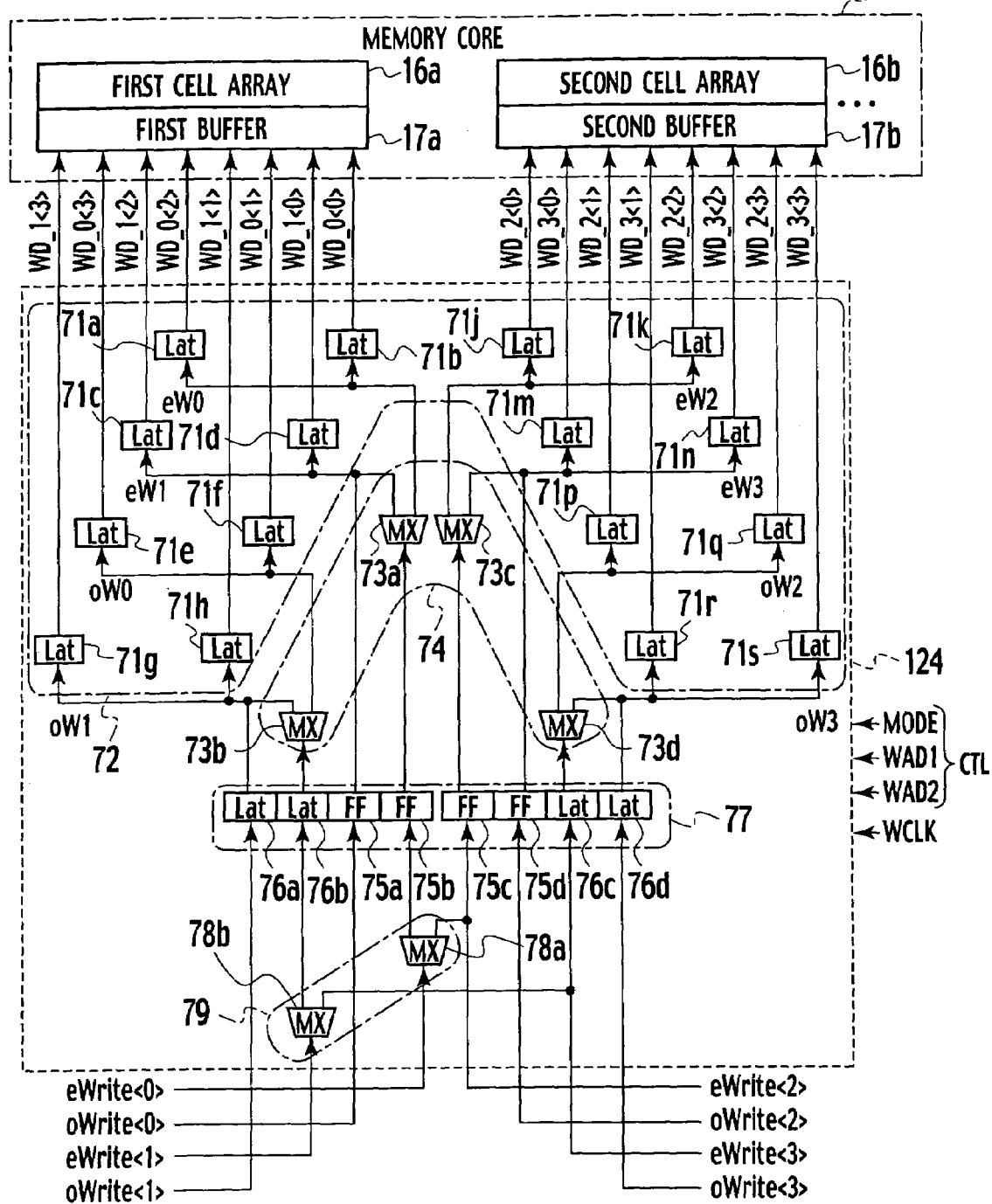
FIG. 19 is a circuit diagram showing a bit width controller according to a first modification of the second embodiment of the present invention.

As shown in FIG. 19, a first bit width controller 124 may include an input distributor 79 connected to an input of the input register 77 instead of the output distributor 42 shown in FIG. 15, as a semiconductor memory according to a first modification of the second embodiment of the present invention. The input distributor 79 distributes the write-data eWrite<0> and oWrite<0> to the input register 77 in accordance with the control data CTL. The input distributor 79 includes a first input demultiplexer 78a and a second input demultiplexer 78b. The distributor 74 includes first to fourth demultiplexers 73a to 73d. Other arrangements are similar to FIG. 15.

The first input demultiplexer 78a has an output connected to each input of the second FF 75b and the third FF 75c. The second input demultiplexer 78b has an output connected to each input of the second input latch circuit 76b and the third input latch circuit 76c. The first input demultiplexer 78a and the second input demultiplexer 78b switches the distribution operation in accordance with the mode-selecting signal MODE and the read out address WAD1.

In the 16 bits mode or the eight bits mode, the first input demultiplexer 78a transmits the even write-data eWrite<0> to second FF 75b regardless of the write address WAD1. In the 16 bits mode or the eight bits mode, the second multiplexer 78b transmits the odd write-data oWrite<0> to the second input latch circuit 76b.

In the four bits mode, the first input demultiplexer 78a and the second multiplexer 78b switch the distribution operations in accordance with the write address WAD1 as shown in FIG. 20. In the four bits mode, the first input demultiplexer 78a selects the second FF 75b when the write address WAD1 is a logic value "0", and selects the third FF 75c when the write address WAD1 is a logic value "1".

The first demultiplexer 73a has an input connected to an output of the second FF 75b. The second demultiplexer 73b has an input connected to an output of the second input latch circuit 76b. The third demultiplexer 73c has an input connected to an output of the third FF 75c. The fourth demultiplexer 73d has an input connected to an output of the third input latch circuit 76c.

The first latch circuit 71a and the second latch circuit 71b has an input connected to an output of the first demultiplexer 73a, and an output connected to an input of the first buffer 17a. The third latch circuit 71c and the fourth latch circuit 71d have inputs connected to outputs of the first FF 75a and the first demultiplexer 73a, and outputs connected to an input of the first buffer 17a. The fifth latch circuit 71e and the sixth latch circuit 71f have inputs connected to an output of the second demultiplexer 73b, and outputs connected to an input of the first buffer 17a. The seventh latch circuit 71g and the eighth latch circuit 71h have inputs connected to outputs of the first input latch circuit 76a and the second demultiplexer 73b, and outputs connected to the first buffer 17a.

The ninth latch circuit 71j and the tenth latch circuit 71k have inputs connected to an output of the third demultiplexer 73c, and outputs connected to an input of the second buffer 17b. The eleventh latch circuit 71m and the twelfth latch circuit 71n have inputs connected to outputs of the fourth FF 75d and the third demultiplexer 73c, and outputs connected to an input of the second buffer 17b. The thirteenth latch circuit 71p and the fourteenth latch circuit 71q have inputs connected to an output of the fourth demultiplexer 73d, and outputs connected to an input of the second buffer 17b. The fifteenth latch circuit 71r and the sixteenth latch circuit 71s have inputs connected to outputs of the fourth input latch circuit 76d and the fourth demultiplexer 73d, and outputs connected to an input of the second buffer 17b.

The first to fourth demultiplexers 73a to 73d switch distribution operations in accordance with the mode-selecting signal MODE and the write address WAD2. In the 16 bits mode, the first demultiplexer 73a transmits output data of the second FF 75b to the first latch circuit 71a and the second latch circuit 71b regardless of the write address WAD2. In the 16 bits mode, the second demultiplexer 73b transmits output data of the second input latch circuit 76b to the fifth latch circuit 71e and the sixth latch circuit 71f. In the 16 bits mode, the third demultiplexer 73c transmits output data of the third FF 75c to the ninth latch circuit 71j and the tenth latch circuit 71k. In the 16 bits mode, the fourth demultiplexer 73d transmits output data of the third input latch circuit 76c to the thirteenth latch circuit 71p and the fourteenth latch circuit 71q.

On the other hand, in the eight bits mode and the four bits mode, the first to fourth demultiplexers 73a to 73d switch the distribution operations in accordance with the write address data WAD2 as shown in FIG. 21. For example, in the eight bits mode and the four bits mode, the first demultiplexer 73a transmits output data of the second FF 75b as write-data eW0 to the first latch circuit 71a and the second latch circuit 71b when the write address data WAD2 is a logic value "0". In the eight bits mode and the four bits mode, the first demultiplexer 73a transmits output data of second FF 75b as write-data eW1 to the third latch circuit 71c and the fourth latch circuit 71d when the write address WAD2 is a logic value "1".

As described above, regarding the semiconductor memory according to the first modification of the second embodiment, the input distributor 79 is connected between the first I/O circuit 13a shown in FIG. 1 and the input register 77 shown in FIG. 2, and the distributor 74 is connected between the input register 77 and the converter 72. Accordingly, it is possible to delete the signal delay that occurs at the input distributor 79 and the distributor 74 as same as FIG. 6.

(Second Modification of Second Embodiment)

Figure 22:
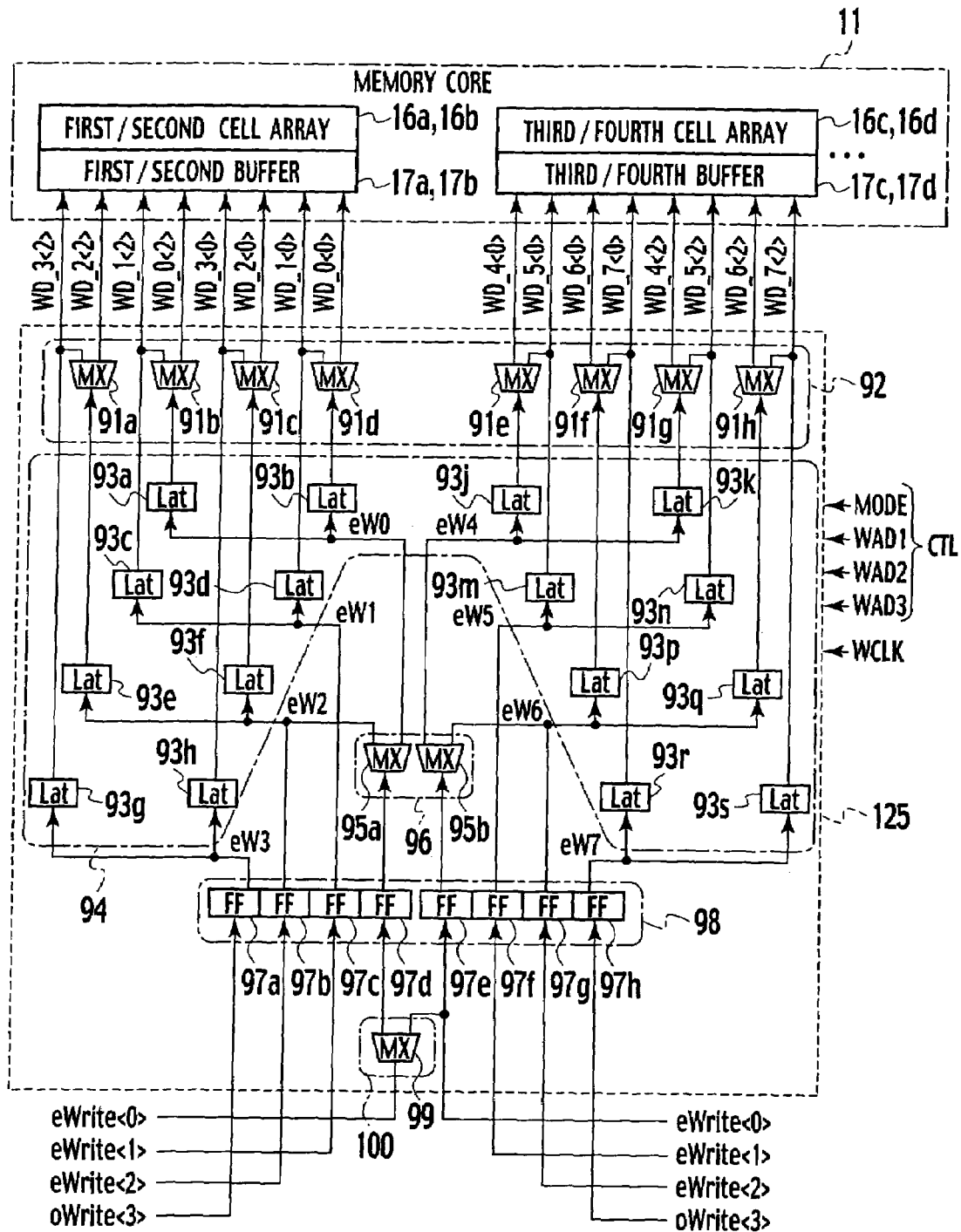
FIG. 22 is a circuit diagram showing a bit width controller according to a second modification of the second embodiment of the present invention

As shown in FIG. 22, a first bit width controller 125 may control even write-data eWrite<0:7> of the write-data eWrite<0:7> and oWrite<0:7> transmitted from the first I/O circuit 13a shown in FIG. 1, as a semiconductor memory according to a second modification of the second embodiment of the present invention. The bit width of the entire semiconductor memory is set to one of the 16 bits, eight bits, four bits, and two bits.

The first bit width controller 125 shown in FIG. 22 differs from FIG. 15 in that the first bit width controller 125 includes an input distributor 100 connected to an input of the input register 98. The input register 98 includes first to eighth FFs 97a to 97h. The distributor 96 includes a first demultiplexer 95a and a second demultiplexer 95b. Each mode of the 16 bits mode, the eight bits mode, the four bits mode, and the two bits mode is achieved by the distribution operations of the input distributor 100, the distributor 96, and the output distributor 92.

The input distributor 100 switches the distribution operation in accordance with the mode selecting signal MODE and the write address data WAD1. The distributor 96 switches the distribution operation in accordance with the mode selecting signal MODE and the write address data WAD2. The output distributor 92 switches the distribution operation in accordance with the mode selecting signal MODE and the write address data WAD3. Other arrangements are similar to FIG. 15.

The input distributor 100 includes an input demultiplexer 99 having an output connected to each input of the fourth FF 97d and the fifth FF 97e. In the 16 bits mode, the eight bits mode, and the four bits mode, the input demultiplexer 99 transmits the write-data eWrite<0> to the fourth FF 97d regardless of the write address data WRAD1. In the two bits mode, the input distributor 100 transmits the write-data eWrite<0> to the fourth FF 97d when the write address data WAD1 is a logic value "0", and transmits the write-data eWrite<0> to the fifth FF 97e when the write address data WAD1 is a logic value "1".

The first demultiplexer 95a has an input connected to an output of the fourth FF 97d. The second demultiplexer 95b has an input connected to an output of the fifth FF 97e. The first latch circuit 93a and the second latch circuit 93b have inputs connected to an output of the first demultiplexer 95a. The third latch circuit 93c and the fourth latch circuit 93d have inputs connected to an output of the third FF 97c. The fifth latch circuit 93e and the sixth latch circuit 93f have inputs connected to outputs of the first demultiplexer 95a and the second FF 97b. The seventh latch circuit 93g and the eighth latch circuit 93h have inputs connected to an output of the first FF 97a.

The ninth latch circuit 93j and the tenth latch circuit 93k have inputs connected to an output of the second demultiplexer 95b. The eleventh latch circuit 93m and the twelfth latch circuit 93n have inputs connected to an output of the sixth FF 97f. The thirteenth latch circuit 93p and the fourteenth latch circuit 93q have inputs connected to outputs of the second demultiplexer 95b and the seventh FF 97g. The fifteenth latch circuit 93r and the sixteenth latch circuit 93s have inputs connected to an output of the eighth FF 97h.

In the 16 bits mode or eight bits mode, the first demultiplexer 95a transmits output data of the fourth FF 97d to the first latch circuit 93a and the second latch circuit 93b regardless of the write address data WAD2. In the 16 bits mode or the eight bits mode, the second demultiplexer 95b transmits output data of the fifth FF 97e to the ninth latch circuit 93j and the tenth latch circuit 93k regardless of the write address data WAD2.

On the other hand, in the four bits mode or the two bits mode, the first demultiplexer 95a and the second demultiplexer 95b switch distribution operation in accordance with the write address data WAD2 as shown in FIG. 23. For example, in the four bits mode or the two bits mode, the first demultiplexer 95a transmits output data of the fourth FF 97d to the first latch circuit 93a and the second latch circuit 93b when the write address data WAD2 is a logic value "0". In the four bits mode or the two bits mode, the first demultiplexer 95a transmits output data of the fourth FF 97d to the fifth latch circuit 93e and the sixth latch circuit 93f when the write address data WAD2 is a logic value "1".

In the eight bits mode, the four bits mode, and the two bits mode the first to eighth output demultiplexers 91a to 91h switch the distribution operation in accordance with the write address data WAD3 as shown in FIG. 24. For example, in the eight bits mode, the four bits mode, and the two bits mode, the first output demultiplexer 91a selects output data of the fifth latch circuit 93e as write-data WD_2<2> when the write address data WAD3 is a logic value "0". In the eight bits mode, the four bits mode, and the two bits mode, the first output demultiplexer 91a selects output data of the fifth latch circuit 93e as write-data WD_3<2> when the write address data WAD3 is a logic value "1".

As described above, regarding the semiconductor memory according to the second modification of the second embodiment, it is possible to provide four patterns of the bit width of the input data, i.e., the 16 bits, the eight bits, the four bits, and the two bits.

(Other Embodiments)

Various modifications will become possible for those skilled in the art after receiving the teachings of the present disclosure without departing from the scope thereof.

The aforementioned first embodiment has been described by way of example in which the first bit width controller 12a performs different processing of even bits and odd bits of the read-data RD_0<0:3> to RD_3<0:3>. However, the first bit width controller 12a may perform same processing of even bits and odd bits. Moreover, it is possible to omit the input selector 22 by utilizing multiplexers having more than two inputs as multiplexers in the selector 26.

The aforementioned first and second embodiments have been described by way of example in which the maximum bits width of the I/O data is 16 bits, and the semiconductor memory includes the first memory unit 110a and the second memory unit 110b. However, it is possible to expand the maximum bits width of the I/O data to 32 bits by including a third memory unit and a fourth memory unit for instance. In this case, the bit width of the I/O data is set to one of the 32 bits, the 16 bits, and eight bits.

The converter 24 includes FFs in the first embodiment, and the converter 44 includes latch circuits in the second embodiment. However, the converter 24 may include latch circuits, and the converter 44 may include FFs.

In the first and second embodiments, a common input type synchronous DRAM (SDRAM) using two clocks is used as the semiconductor memory 1. However, a normal SDRAM which receives address data from address bus and utilizes a clock is used as the semiconductor memory 1. Furthermore, various semiconductor memories providing a bit width control function are used as the semiconductor memory 1 without limiting the SDRAM.

What is claimed is:

1. A semiconductor memory comprising:
   a converter configured to convert each read-data of plural bits read from a memory core into serial data, respectively, in synchronization with a read clock to generate converted read-data, the converted read-data referring to the each read data converted into the serial data;
   an output register configured to hold the converted read-data in synchronization with the read clock; and a selector configured to select one bit from each plural bits of the converted read-data, in accordance with a control data, and to supply the selected bit to the output register, wherein read address data for the memory core and a mode selecting signal for indicating bit width of output data of the I/O circuit are utilized as the control data.

2. The semiconductor memory of claim 1, further comprising an I/O circuit configured to transmit output data of the output register to external devices in synchronization with the read clock.

3. The semiconductor memory of claim 1, wherein the selector comprises a plurality of multiplexers configured to select one bit from two bits of the converted read-data.

4. The semiconductor memory of claim 1, wherein the converter converts two bits of the read-data into the serial data.

5. The semiconductor memory of claim 1, wherein the converter separately converts even bits and odd bits of the read-data into the serial data, and generates the converted read-data.

6. The semiconductor memory of claim 5, further comprising an I/O circuit configured to select the converted read-data having the even bits and the converted read-data having the odd bits by turns, in synchronization with the read clock.

7. The semiconductor memory of claim 1, further comprising an input selector configured to select one bit from each plural bits of the read-data, in accordance with the control data, and to supply the selected bit to the converter.

8. The semiconductor memory of claim 1, further comprising an output selector configured to select one bit from each plural bits of output data of the output register, in accordance with the control data.

9. The semiconductor memory of claim 1, further comprising:

an input selector configured to select one bit from each plural bits of the read-data, in accordance with the control data, and to supply the selected bit to the converter; and an output selector configured to select one bit from each plural bits of the output data of the output register, in accordance with the control data.

10. The semiconductor memory of claim 1, wherein the converter selects one bit from each plural bits of the read-data, in accordance with the control data, and converts the selected read-data into the serial data, and generates the converted read-data.

11. The semiconductor memory of claim 10, wherein the converter comprises:

a plurality of flip-flops configured to hold the read-data of plural bits; and a plurality of multiplexing flip-flops configured to select one bit from each plural of bits of the read-data, and to hold the selected read-data.

12. A semiconductor memory comprising:

an input register configured to hold write-data in synchronization with a write clock;

a converter configured to convert each bit of the held write-data into parallel data in synchronization with the write clock, and to supply the converted write-data to a memory core; and a distributor configured to distribute the held write-data to the converter in accordance with control data, wherein write address data for the memory core and a mode selecting signal for indicating bit width of input data are utilized as the control data.

13. The semiconductor memory of claim 12, further comprising an output distributor configured to distribute the converted write-data to the memory core in accordance with the control data.

14. The semiconductor memory of claim 12, further comprising an input distributor configured to distribute the write-data to the input register in accordance with the control data.

15. The semiconductor memory of claim 12, further comprising:

an input distributor configured to distribute the write-data to the input register in accordance with the control data; and an output distributor configured to distribute the converted write-data to the memory core in accordance with the control data.

16. The semiconductor memory of claim 12, wherein the converter converts each bit of the held write-data into two bits of the parallel data.

17. The semiconductor memory of claim 12, further comprising an I/O circuit configured to supply input data from external devices as the write-data to the input register in synchronization with the write clock.

18. The semiconductor memory of claim 17, wherein the I/O circuit divides the input data into even bits and odd bits, and generates the write-data.

* * * * *